(12) United States Patent
Shiotsuka et al.

(10) Patent No.: US 6,175,075 B1
(45) Date of Patent: Jan. 16, 2001

(54) SOLAR CELL MODULE EXCELLING IN RELIABILITY

(75) Inventors: Hidenori Shiotsuka; Ichiro Kataoka, both of Kyotanabe; Satoru Yamada, Nara; Shigeo Kiso, Kyotanabe, all of (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/295,373

(22) Filed: Apr. 21, 1999

(30) Foreign Application Priority Data

Apr. 21, 1998 (JP) .................................................. 10-110290

(51) Int. Cl.$^7$ ............................................... H01L 31/0203
(52) U.S. Cl. ........................... 136/251; 136/244; 136/259
(58) Field of Search .................... 136/244, 251, 136/259

(56) References Cited

U.S. PATENT DOCUMENTS

| | | | |
|---|---|---|---|
| 2,938,938 | * 5/1960 | Dickson | 136/89 |
| 4,415,759 | * 11/1983 | Copeland et al. | 136/246 |
| 4,430,519 | * 2/1984 | Young | 136/244 |
| 4,605,813 | * 8/1986 | Takeuchi et al. | 136/244 |
| 4,916,503 | * 4/1990 | Uematsu et al. | 357/30 |
| 5,011,544 | * 4/1991 | Gaddy et al. | 136/246 |
| 5,024,953 | * 6/1991 | Uematsu et al. | 437/2 |
| 5,217,540 | * 6/1993 | Ogura | 136/251 |
| 5,476,553 | * 12/1995 | Hanoka et al. | 136/241 |
| 5,530,264 | * 6/1996 | Kataoka et al. | 257/40 |
| 5,542,989 | * 8/1996 | Ichikawa | 136/251 |
| 5,582,653 | * 12/1996 | Kataoka et al. | 136/251 |
| 5,660,646 | * 8/1997 | Kataoka et al. | 136/251 |

FOREIGN PATENT DOCUMENTS 036404   2/1997   (JP) .

* cited by examiner

Primary Examiner—Rena L. Dye
Assistant Examiner—Michael C. Miggins
(74) Attorney, Agent, or Firm—Fitzpatrick, Cella, Harper & Scinto

(57) ABSTRACT

A solar cell module which comprises a photovoltaic element string comprising a plurality of photovoltaic elements electrically connected with each other by means of an electric connection material, said photovoltaic element string being sealed by a sealing material, wherein when an area of one (a) of said plurality of photovoltaic elements is represented by A and a sum of clearances areas between said photovoltaic element (a) and adjacent photovoltaic elements (b) situated next to said photovoltaic element (a) is represented by B, the area ratio of B/A is in a range of 0.003 to 0.045. A process for producing a solar cell module using said photovoltaic element string by a vacuum lamination method.

10 Claims, 10 Drawing Sheets

AREA RATIO B/A

—✕— : ELEMENT'S BACK FACE

---■--- : INTER ELEMENT

SOLAR CELL MODULE EXCELLING IN RELIABILITY

BACKGROUND OF THE INVENTION

1. Field of the Invention

The present invention relates to a highly reliable solar cell module and a process for said solar cell module.

2. Related Background Art

Japanese Unexamined Patent Publication No. 36404/1997 discloses a photovoltaic element having a configuration as shown in FIGS. 2(a) and 2(b) FIG. 2(a) is a schematic plan view, viewed from a light receiving face side of the photovoltaic element, and FIG. 2(b) is a schematic cross-sectional view, taken along the A—A' line in FIG. 2(a). Particularly, in FIGS. 2(a) and 2(b), reference numeral 201 indicates a semiconductor element (or a photovoltaic element) whose light receiving face side comprises a power generation region with an upper electrode layer 201' provided on a semiconductor layer (not shown) and a peripheral non-power generation region which is free of said upper electrode layer. On each of the opposite end portions of the non-power generation region, an insulating adhesive body 202 is arranged while being fixed thereto. Reference numeral 203 indicates a collecting electrode comprising a plurality of wires arranged on the power generation region at an equal interval to extend onto the insulating adhesive bodies 202 in the non-power generation region such that their opposite end portions are situated on the insulating adhesive bodies 202. Reference numeral 204 indicates a positive electrode terminal member which is contact-bonded on each adhesive body 202 having the extended end portions of the wires as the collecting electrode 203 situated thereon so as to have electrical connection with the wires as the collecting electrode. Reference numeral 205 indicates a negative electrode terminal member which is fixed to the back face of the photovoltaic element so as to have electrical connection by way of soldering, laser beam welding, or ultrasonic welding.

FIG. 3 is a schematic cross-sectional view illustrating an example of a photovoltaic element string comprising a plurality of photovoltaic elements having such configuration as shown in FIGS. 2(a) and 2(b) which are electrically connected with each other in series. Particularly, FIG. 3 is a schematic cross-sectional view illustrating the constitution of a given, serialized portion of said photovoltaic element string in which a photovoltaic elements 301 (a semiconductor element) and a photovoltaic element 311 (a semiconductor element) are serialized. Specifically, a positive electrode terminal 304 which is electrically connected with a collecting electrode 303 on an insulating adhesive body 302 arranged on a peripheral non-power generation region of a photovoltaic element 301 is extended outside the photovoltaic element 301 and it is electrically connected to a negative electrode terminal 315 arranged at a back face of an adjacent photovoltaic element 311 by means of a solder 306, whereby the photovoltaic element 301 and the photovoltaic element 311 are connected in series. Reference numeral 307 indicates a filler resin which fills the spaces between the two elements while enclosing them. Reference numeral 305 indicates a negative electrode terminal, reference numeral 312 an insulating adhesive body, reference numeral 313 a collecting electrode, and reference numeral 314 a positive electrode terminal.

FIG. 5 is a schematic view illustrating an embodiment of sealing a photovoltaic element string by laminating a plurality of lamination materials to produce a solar cell module by a vacuum lamination method. In FIG. 5, reference numeral 501 indicates a photovoltaic element string comprising a plurality of photovoltaic elements electrically connected with each other, for instance, as shown in FIG. 3. Reference numeral 502 indicates a back side nonwoven glass fiber member which is arranged on the back face side of the photovoltaic element string 501, reference numeral 503 is a surface side nonwoven glass fiber member which is arranged on the light receiving face side of the photovoltaic element string 501, reference numeral 504 is a surface side filler resin, reference numeral 505 is a surface protective film, reference numeral 506 is a back side filler resin, reference numeral 507 is an insulating film, and reference numeral 508 is a back face reinforcing member. The back side nonwoven glass fiber member 502 is used in order to foster deaeration in the back face side of the photovoltaic element string 501 and is also used as a spacer in order to ensure electrical insulation of the photovoltaic element string. The surface side nonwoven glass fiber member 503 is used in order to foster deaeration in the light receiving face side of the photovoltaic element string 501 and also in order to attain an improved surface protective performance in the light receiving face side of the photovoltaic element string.

FIG. 7 [comprising FIGS. 7(a) to 7(c)] and FIG. 8 [comprising FIGS. 8(a) to 8(c)] are schematic top views respectively illustrating an example of a conventional crystalline series photovoltaic element string comprising a plurality of crystalline series photovoltaic element having a small area which are electrically serialized with each other. FIG. 7 [FIGS. 7(a) to 7(c)] and FIG. 8 [FIGS. 8(a) to 8(c)] are top views respectively of a horizontal cross section.

Particularly, FIG. 7(a) shows a crystalline series photovoltaic element 701 shaped as a square 100 mm×100 mm in size, and FIG. 7(b) shows a crystalline series photovoltaic element string comprising a plurality of the photovoltaic elements 701 which are spaced at an equal interval of 1.5 mm while being electrically connected with each other in series. In the case of the photovoltaic element string shown FIG. 7(b), as shown in FIG. 7(c), when the area of a given photovoltaic element (a) is A and a sum of the clearances (hatched by oblique lines) between said photovoltaic element (a) and adjacent photovoltaic elements (b) arranged next to the photovoltaic element (a) is B, the ratio of B/A is about 0.061.

FIG. 8(a) shows a crystalline series photovoltaic element 801 shaped in as a square 100 mm×100 mm in size with four corners cut off, and FIG. 8(b) shows a crystalline series photovoltaic element string comprising a plurality of the photovoltaic elements 801 which are spaced at an equal interval of 2 mm with respect to the lateral arrangement and at an equal interval of 5 mm with respect to the longitudinal arrangement while being electrically connected with each other in series. In the case of the photovoltaic element string shown FIG. 8(b), as shown in FIG. 8(c), when the area of a given photovoltaic element (a) is A and a sum of the clearances (hatched by oblique lines) between said photovoltaic element (a) and adjacent photovoltaic elements (b) arranged next to the photovoltaic element (a) is B, the ratio of B/A is about 0.157.

By the way, a solar cell module is usually prepared by a vacuum lamination method comprising the steps of stacking at least a resin sheet as a lamination material on each of the opposite sides of a given photovoltaic element string to form a stacked body, subjecting the stacked body to vacuum treatment to sufficiently deaerate the inside thereof, and subjecting the stacked body to thermocompression bonding treatment.

FIG. 6(a) is a schematic view illustrating a photovoltaic element string as an example of the above photovoltaic element string, comprising a plurality of relatively small photovoltaic elements 601 of 100 mm×100 mm in size which are spaced at an equal interval (602) while connected in a series.

In the case of preparing a solar cell module using the photovoltaic element string shown in FIG. 6(a) in accordance with the above described vacuum lamination method, the deaeration with respect to each of the photovoltaic elements of the photovoltaic element string in the vacuum treatment step is conducted mainly in directions shown by arrows in FIG. 6(a) by means of attraction. Particularly, in the stacking step in the vacuum lamination method, there is obtained a stacked body in which a resin sheet is stacked on the front side of the photovoltaic element string and another resin sheet stacked on the back side of said string. When the stacked body is subjected to the vacuum treatment, the front side of the stacked body can be sufficiently vacuumed to effectively evacuate air and gas component present therein by means of attraction. This due to the following reasons. The front face (the light receiving face) side of each of the photovoltaic elements constituting the photovoltaic element string is provided with a collecting electrode and the like as previously described with reference to FIGS. 2(a) and 2(b) and therefore, a lot of irregularities based on the collecting electrodes and the like of the photovoltaic elements are present at the front side of the photovoltaic element string. Hence, the resin sheet is not in close contact with the front face side of each of the photovoltaic elements, where air and gas component present in the front side of the stacked body are removed.

On the other hand, the back side of the stacked body has a tendency not to be as sufficiently vacuumed as the front side, for the reasons that the back face of each of the photovoltaic elements constituting the photovoltaic element string is substantially free of irregularities because the back face is provided with merely a bus bar. Therefore, the resin sheet is liable to be ine close contact with the back face due to attraction, where air or gas is occasionally confined. However, such air or gas can be evacuated by means of attraction because the migration distance of air or gas (that is, the distance for air or gas to migrate toward and reach the peripheries where it is removed by means of attraction) is short.

Now, it is difficult to produce a large area crystalline series solar cell module because a large crystalline series photovoltaic element having a large area is difficult produce on an industrial scale. However, in the case of an amorphous silicon solar cell module, it can be optionally designed to have a large area because it is possible to produce a large amorphous silicon photovoltaic element having a large area on an industrial scale. An example of such large area amorphous silicon photovoltaic element, is an amorphous silicon photovoltaic element 350 mm×240 mm in size.

FIG. 6(b) shows an example of an amorphous silicon photovoltaic element string comprising a plurality of such large area amorphous silicon photovoltaic elements 603 which are spacedly arranged at an equal interval (604) while connected in series.

In the case of preparing a solar cell module using the photovoltaic element string shown in FIG. 6(b) in accordance with the foregoing vacuum lamination method wherein a stacked body is formed, the stacked body is subjected to a vacuum treatment, and the vacuum-treated stacked body is subjected to thermocompression bonding treatment, in the vacuum treatment step, the front side of the stacked body can be sufficiently vacuumed to effectively evacuate air and gas component present therein as well as in the foregoing case. However, for the back side of the stacked body, when air or gas is present under the photovoltaic element as in the foregoing case, the migration distance for air or gas (that is, the distance for air or gas to migrate toward and reach the peripheries where air or gas, is removed by means of attraction) is fairly long. Because of this, such problems as will be described in the following are liable to occur.

That is, in practice, the preparation of a large area amorphous silicon solar cell module is conducted, for example, in the following manner. Firstly, there is provided an amorphous silicon photovoltaic element string comprising a plurality of amorphous silicon photovoltaic elements having a large area which are electrically serialized as shown in FIG. 6(b). Given surface side lamination materials including a surface side filler resin sheet are stacked on the light receiving face side of the photovoltaic element string and given back side lamination materials including a back side filler resin sheet are stacked on the back face side of the photovoltaic element string to form a stacked body. The stacked body is subjected to vacuum treatment to sufficiently deaerate the inside, followed by a thermocompression bonding treatment. In the vacuum treatment step, it is necessary to evacuate air or gas between the respective lamination materials and between the photovoltaic element string and the lamination materials before the surface side filler resin sheet and the back side filler resin sheet are fused. When the deaeration is insufficient, residual air bubbles remain in the resulting solar cell module. In this case, such air bubbles expand due to a temperature change in heat cycle test or in the surrounding atmosphere to cause peeling among the lamination materials. Particularly, as previously described, the back face of each of the photovoltaic elements constituting the photovoltaic element string is provided with few irregularities and because of this, the back face of the photovoltaic element is liable to be in close contact with the resin upon deaerating the inside of the stacked body in the vacuum treatment step. In the case where the back face of the photovoltaic element is in close contact with the resin, when air (or gas) is present in the portion in close contact, the air is difficult to evacuate. As a result, residual air bubbles remain therein, resulting in such problem as described above in that the air bubbles expand due to a temperature change to cause peeling among the lamination materials.

As previously described, in the case where a photovoltaic element string comprising a plurality of small-sized photovoltaic elements serialized with each other is subjected to lamination treatment by the vacuum lamination method in order to produce a solar cell module, since for each of the photovoltaic elements constituting the photovoltaic element string, the distance between the central portion to the peripheral portion is short, sufficient deaeration can be conducted through the peripheral portions of the photovoltaic element string.

However, in the case of a photovoltaic element string comprising a plurality of large-sized photovoltaic elements connected in series, because each of the photovoltaic elements constituting the photovoltaic element string is the distance from the central portion that to the peripheral portion is fairly long, sufficient deaeration is difficult to conduct only through the peripheral portions of the photovoltaic element string, and residual air bubbles remain in the resulting solar cell module. The solar cell module containing such residual air bubble therein are likely to be inferior in reliability when continuously used over a long period of time under severe outdoor environments with changes in the temperature and humidity.

Incidentally, as previously described with reference to FIG. 5, in the case of sealing a photovoltaic element string by laminating a plurality of lamination materials to produce a solar cell module in accordance with the vacuum lamination method, it is known that a surface side nonwoven glass fiber member 503 is arranged on the light receiving face side of the photovoltaic element string in order to foster the deaeration in the front side and a back side nonwoven glass fiber member 502 is arranged on the back face side of the photovoltaic element string in order to foster the deaeration in the back side.

However, this is problematic in the case of producing a long solar cell module using a long photovoltaic element string. That is, when the long photovoltaic element string is stacked on a long nonwoven glass fiber member which is situated on the back face side, the corners of the photovoltaic elements constituting the photovoltaic element string are caught by the nonwoven glass fiber member, and the nonwoven glass fiber member is broken or the photovoltaic element string is turned up or down. Therefore, an extra step is necessitated in order to eliminate these problems or prevent their occurrence. This situation results in complicating the solar cell module production process.

Now, in order to make a solar cell module have a creep rupture resistance, its lamination material is crossliked by a crosslinking agent usually comprising an organic peroxide. In this case, there is a problem in that when the organic peroxide as the crosslinking agent is heated, the organic peroxide is decomposed while producing radicals, and decomposed residuals become gas components.

In the case of a lamination constitution as shown in FIG. 5 in which the back side filler resin 506 is interposed between the photovoltaic element string 501 and the back face reinforcing member 508, when the back side filler resin 506 is incorporated with an organic peroxide as the crosslinking agent, in the thermocompression treatment, gas based on residuals caused when the organic peroxide is decomposed can remain under the photovoltaic element string. This gas is generated after the back side filler resin 506 is fused. Because of this, even when the nonwoven glass fiber member 502 is used, the nonwoven glass fiber member is impregnated with the fused back side filler resin 506 and therefore, degassing is not effectively provided. In the case of a solar cell module in which a decomposed material of the organic peroxide is remains as an air bubble under the photovoltaic element string, when the solar cell module is continuously exposed to a severe outdoor atmosphere with changes in the temperature and humidity, there is a tendency for the air bubble to grow to cause peeling between the back side filler and the photovoltaic element string.

Separately, in the case where the clearance between each adjacent photovoltaic element of the photovoltaic element string is excessively widened in order foster the deaeration or the degassing, such problems as will be described in the following can occur.

That is, in the case of a solar cell module obtained by resin-sealing a photovoltaic element string on a metal steel plate using such lamination materials as shown in FIG. 5 in accordance with the vacuum lamination method, the substrate of each of the photovoltaic element constituting the photovoltaic element string comprises a metal plate or a wafer plate which is relatively rigid and because of this, the solar cell module has a portion in which the photovoltaic elements are present and another portion in which no photovoltaic elements are present, wherein the rigidity of the former is quite different from that of the latter. In such a solar cell module, when the clearance between each adjacent photovoltaic element is excessively widened, the rigidity of a portion where the connection portion of the adjacent photovoltaic elements (the clearance between the adjacent photovoltaic elements) is situated is smaller than that of a portion where the photovoltaic element is situated. This solar cell module suffer from such problems as will be described in the following. That is, the solar cell module is undesirably bent or curved when it is transported or when it is subjected to roll forming, where the nonwoven glass fiber member enclosed in the filler resin is bulked to blanch or peeling occurs between the nonwoven glass fiber member and the filler resin. When the peeling occurs between the nonwoven glass fiber member and the filler resin, gaps can form, and water can accumulate in the gaps due to dew condensation because of repetition of wetting and cooling, resulting of deterioration in the electric characteristics of the solar cell module.

Further, in a conventional solar cell module comprising a photovoltaic element string, with respect to connection of each adjacent photovoltaic elements of the photovoltaic element string such problems can occur, as well as the ones described in the following.

That is, when each adjacent photovoltaic element of the photovoltaic element string is electrically connected so as to have a diminished clearance between the photovoltaic elements in order to improve the filling efficiency by the filler resin, as shown in FIG. 3, the semiconductor element 311 (the photovoltaic element) is arranged such that it is shifted above the semiconductor element 301 (the photovoltaic element). Thus, the step X with respect to the positions of the adjacent photovoltaic elements becomes large. In the case where a photovoltaic element string comprising a plurality of photovoltaic elements which are electrically serialized with each other in the manner as shown in FIG. 3 is sealed by the transparent resin 307 in order to produce a solar cell module, problems can occur, as will be described in the following. That is, as shown in FIG. 3, the thickness Y of the transparent resin 307 as the filler resin situated on an end portion of the photovoltaic element is partially thinned or a stepped portion is not sufficiently filled, where a residual air bubble is formed. The solar cell module produced in this case can have such problems as will be described in the following. That is, when the solar cell module is continuously exposed to severe outdoor environments over a long period of time, the transparent resin is decomposed mainly due to ultraviolet rays impinged therein. In this case, when a nonwoven glass fiber member is present while being enclosed in the transparent resin, in the portion where the transparent resin is thinned, the nonwoven glass fiber member tends to partially rise to the surface causing a gap. In this gap, water is can accumulate due to dew condensation because of repetition of wetting and cooling, resulting in deterioration in the electrical characteristics of the solar cell module.

In order to prevent the nonwoven glass fiber member from being exposed from the transparent resin, increasing the proportion of the amount of the transparent resin versus that of the nonwoven glass fiber member has been considered . However, this is problematic and is not acceptable in practice.

It is generally recognized that in the case where a solar cell module is installed on a roof of a building by integrating with a roofing member, the temperature inside the solar cell module becomes about 45° C. higher than atmospheric temperature around the solar cell module when it is exposed to 1 SUN (full solar radiation (including direct solar radiation and sky solar radiation) of 100 mW/cm²). It means that when the atmospheric temperature around the solar cell module is 35° C., the inside temperature of the solar cell module becomes 80° C. Under the condition of such inside temperature of the solar cell module, the surface side coating resin of the solar cell module gradually deteriorates and becomes yellowed. In this case, the quantity of incident light which is impinged through the surface side coating resin to reach the photovoltaic elements is decreased. The extent of the decrease in the light transmittance of the surface side coating resin due to the yellowing is enlarged as the thickness of the surface side coating resin is increased. Thus, there is a tendency that the output power of the solar cell module is decreased as the thickness of the transparent resin is increased.

Besides, it is known that when a resin containing an organic peroxide as a crosslinking agent is sandwiched between a pair of gas-impermeable members, e.g., a glass substrate and a photovoltaic element, and the resin is crosslinked by the organic peroxide, the organic peroxide is decomposed by the application of heat to produce a decomposed residual as gas, where the amount of gas generated is increased as the amount of the resin is increased. Also, when the thickness (that is, the amount) of the transparent resin is increased, air bubbles can form in the light receiving face side.

SUMMARY OF THE INVENTION

A principal object of the present invention is to eliminate the foregoing problems in the prior art and provide an improved solar cell module which excels in reliability.

Another object of the present invention is to provide an improved solar cell module which stably and continuously exhibits desirable electric characteristics without deterioratation, even when it is exposed to severe atmospheric conditions with changes in the temperature and humidity over a long period of time.

A further object of the present invention is to provide a solar cell module with a photovoltaic element string comprising a plurality of photovoltaic elements spacedly arranged so as to have a desired clearance between each adjacent photovoltaic element while being electrically connected with each other by an electric connection material, each of said plurality of photovoltaic elements having a desired area, and said photovoltaic element string being sealed by a sealing material, characterized such that when the area of one (a) of said plurality of photovoltaic elements is represented by A and a sum of the areas of the clearances between said photovoltaic element (a) and adjacent photovoltaic elements (b) situated next to said photovoltaic element (a) is represented by B, the area ratio of B/A is in a range of 0.003 to 0.045.

A further object of the present invention is to provide a process for producing a solar cell module, comprising the steps of forming a stacked body comprising a photovoltaic element string interposed between a pair of lamination materials, and subjecting said stacked body to vacuum lamination treatment whereby said photovoltaic element string is sealed by said pair of lamination materials, wherein said photovoltaic element string comprises a plurality of photovoltaic elements having a desired area spaced so as to have a desired clearance between each adjacent photovoltaic element while being electrically connected with each other by an electric connection material, and when the area of one (a) of said plurality of photovoltaic elements is represented by A and a sum of the areas of the clearances between said photovoltaic element (a) and adjacent photovoltaic elements (b) situated next to said photovoltaic element (a) is represented by B, the area ratio of B/A is in a range of 0.003 to 0.045.

DETAILED DESCRIPTION OF THE INVENTION AND PREFERRED EMBODIMENTS

The present invention is directed to eliminate the foregoing problems found in the prior art and to attain the above described objects.

The present invention provides an improved solar cell module which is free of the problems found in the prior art and which with stability continuously exhibits desirable electric characteristics without deterioration, even when it is exposed to severe atmospheric conditions with changes in the temperature and humidity over a long period of time. The present invention also provides a process for the production of said solar cell module by a vacuum lamination method.

A typical embodiment of the solar module provided by the present invention is a solar cell module which comprises a photovoltaic element string comprising a plurality of photovoltaic elements having a desired area spaced so as to have desired clearances between each adjacent photovoltaic element while being electrically connected with each other by means of an electric connection material, said photovoltaic element string being sealed by a sealing material, characterized in that when the area of one (a) of said plurality of photovoltaic elements is represented by A and a sum of the areas of the clearances of the adjacent photovoltaic elements (b) situated next to said photovoltaic element (a) is represented by B, the area ratio of B/A is in a range of 0.003 to 0.045.

Figure 7A:
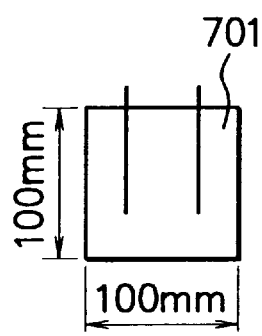
FIGS. 7(a) to 7(c) are schematic top views illustrating an example of a conventional crystalline series photovoltaic element string.
Figure 7C:
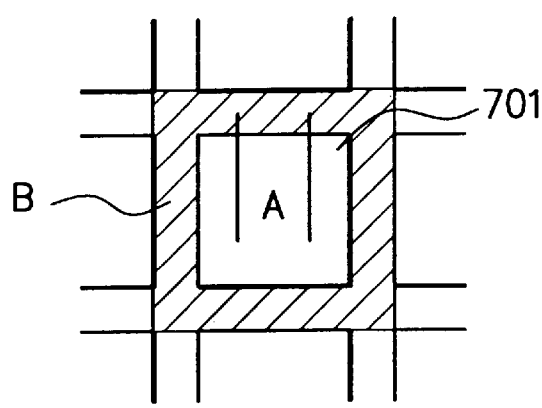
Figure 7B:
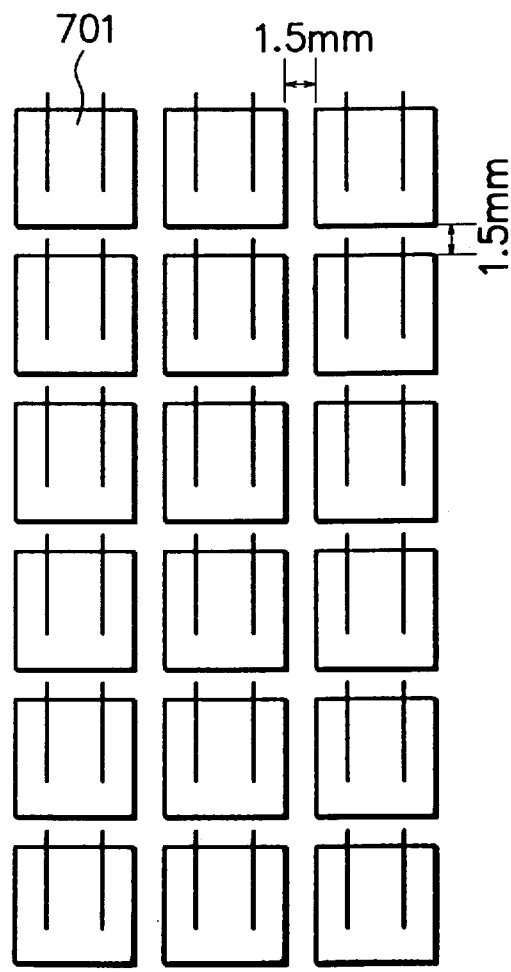
Figure 8A:
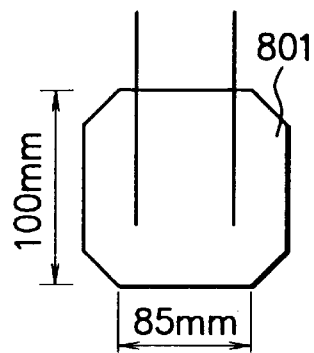
FIGS. 8(a) to 8(c) are schematic top views illustrating another example of a conventional crystalline series photovoltaic element string.
Figure 8C:
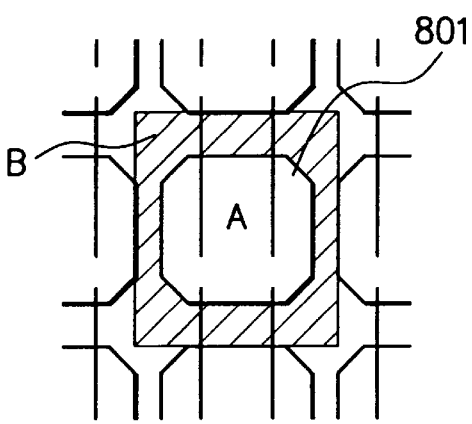
Figure 8B:
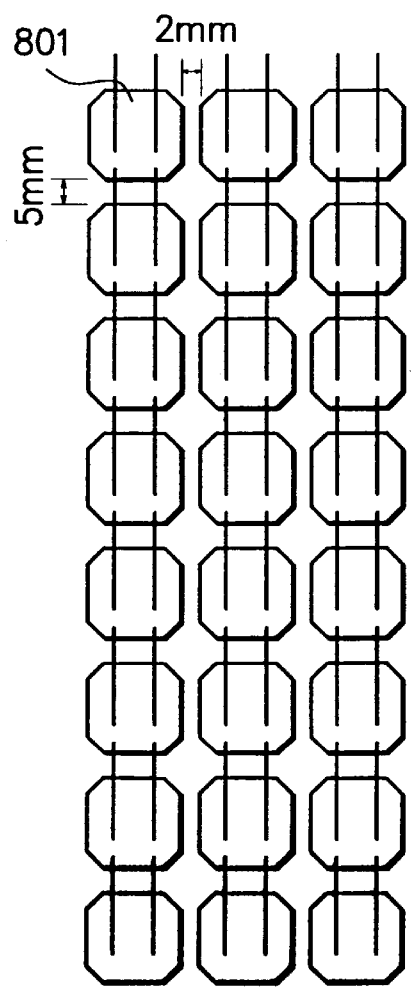

Here, the meaning of each of said A and B in the present invention will be described. The terms A and B are the same as A and B shown in FIG. 7(c) or FIG. 8(c) Specifically, the terms A and B in the present invention are of a horizontal cross section of a photovoltaic element string in which a plurality of photovoltaic elements are spacedly arranged while being electrically connected with each other. Thus, the area represented by the term A in the present invention means a solid area of one (a) of the photovoltaic elements of the photovoltaic element string in the horizontal cross section. Similarly, the area represented by the term B means a sum of the areas of the clearances between said photovoltaic element (a) and adjacent photovoltaic elements (b) arranged next to the photovoltaic element (a).

The solar cell module described above is free of the problems found in the prior art and excels in reliability. Specifically, the solar cell module according to the present invention with stability continuously exhibits desirable electric characteristics without deterioration, even when it is exposed to severe atmospheric conditions with changes in the temperature and humidity over a long period of time.

A typical embodiment of the process for the production of a solar cell module according to the present invention comprises the steps of forming a stacked body comprising a photovoltaic element string interposed between a pair of lamination materials, and subjecting said stacked body to vacuum lamination treatment whereby said photovoltaic element string is sealed by said pair of lamination materials, wherein said photovoltaic element string comprises a plurality of photovoltaic elements having a desired area spaced so as to have a desired clearance between each adjacent photovoltaic element while being electrically connected with each other by an electric connection material, and when the area of one (a) of said plurality of photovoltaic elements is represented by A and a sum of the areas of the clearances between said photovoltaic element (a) and adjacent photovoltaic elements (b) situated next to said photovoltaic element (a) is represented by B, the area ratio of B/A is in a range of 0.003 to 0.045.

In the solar cell module according to the present invention, it is preferred that the number of the adjacent photovoltaic elements (b) situated next to the photovoltaic element (a) is two or more. And the photovoltaic elements constituting the photovoltaic element string may be electrically connected with each other either in series or in parallel. Further, each of the photovoltaic elements constituting the photovoltaic element string may be shaped as a square or as a rectangular.

In the solar cell module according to the present invention, it is preferred that the step between each adjacent photovoltaic element of the photovoltaic element string is smaller than the thickness of the electric connection material. The sealing material situated on the electric connection material of connecting each adjacent photovoltaic elements of the photovoltaic element string is preferred to have a thickness of 200 μm or more. The electric connection material that connects each adjacent photovoltaic element of the photovoltaic element string is preferred to be positioned on the front side (the light receiving face side) of the photovoltaic element string.

The electric connection material that connects each adjacent photovoltaic element of the photovoltaic element string may comprise a metal foil member whose surface is covered by an electrically insulating material.

In the solar cell module according to the present invention, it is preferred that the electric connection material that connects each adjacent photovoltaic element of the photovoltaic element string is positioned on the front side of the photovoltaic element string, and an electrode having a polarity which is different from that of the electric connection material is provided at the back face of each of the photovoltaic elements.

In the solar cell module according to the present invention, the sealing material by which the photovoltaic element string is sealed may comprise a front side covering material comprising a transparent sealing resin and a transparent film laminated in this order on the front side (the light receiving face side) of the photovoltaic element string and a back side covering material comprising a metallic reinforcing member which is laminated on the back side of the photovoltaic element string through a sealing resin.

The present invention provides such significant advantages as will be described below.

Figure 5:
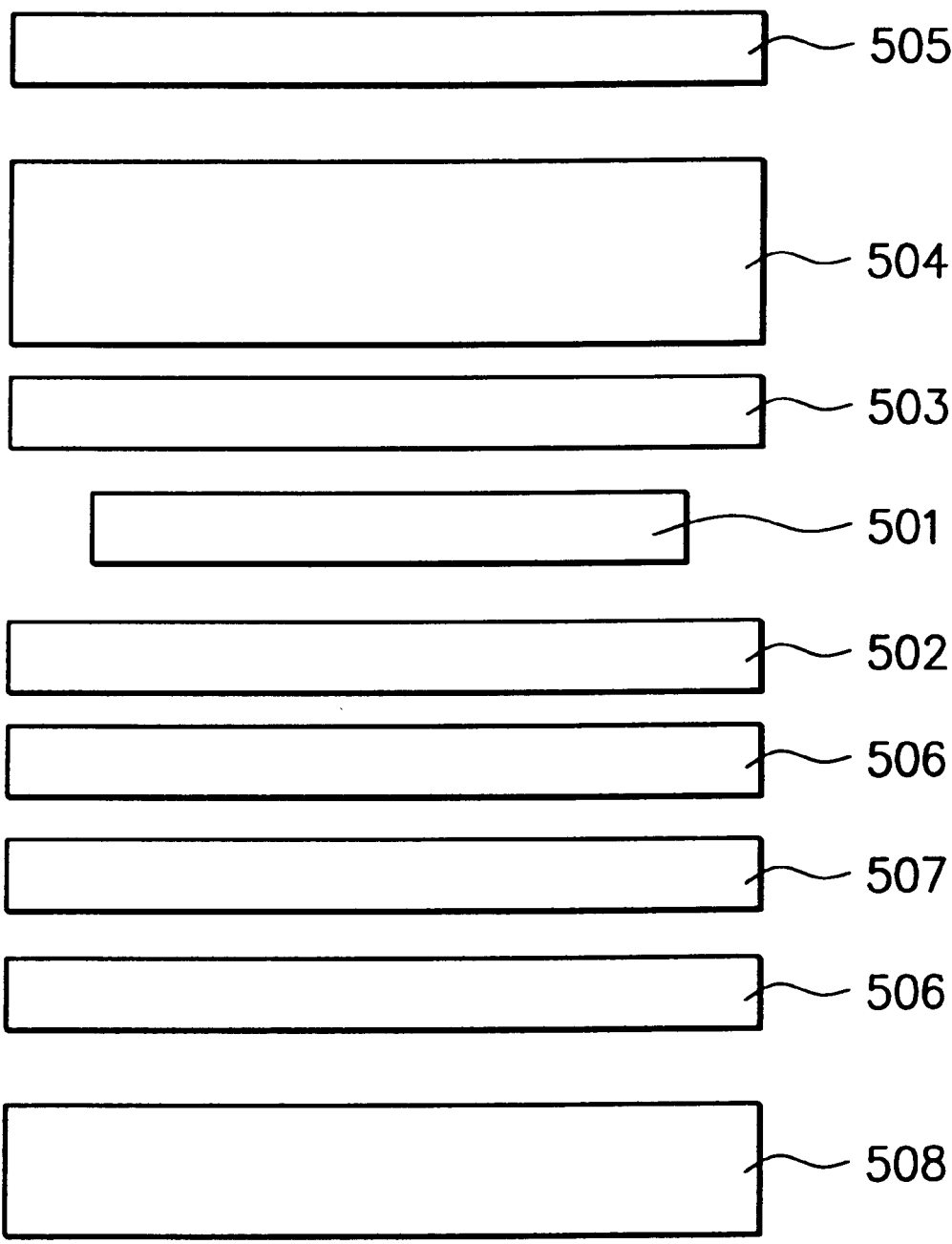
FIG. 5 is a schematic view illustrating an example of the constitution of a stacked body of a conventional solar cell module.
Figure 6A:
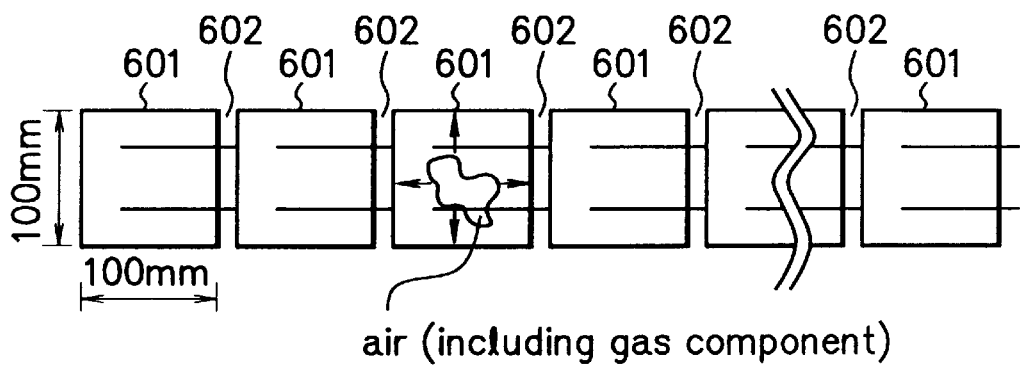
FIGS. 6(a) and 6(b) are schematic top views respectively illustrating a photovoltaic element string which is used for explaining the situation of deaeration in the production of a solar cell module.
Figure 6B:
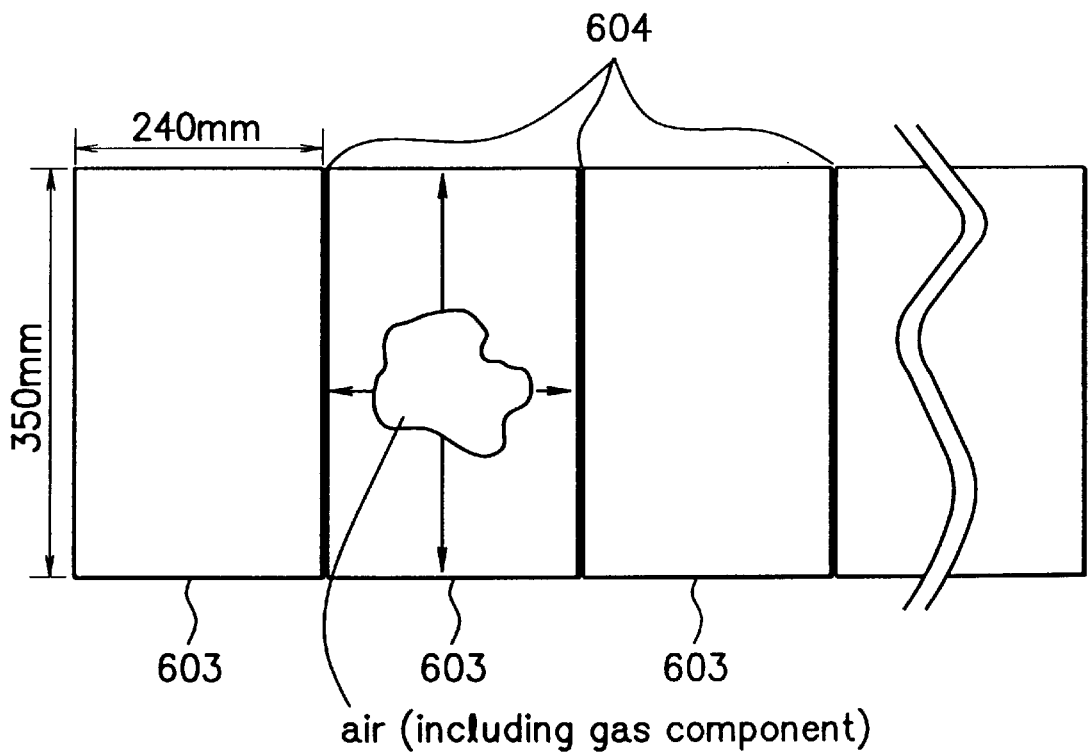

(1). By making the ratio of B/A to be more than 0.003 as described above, the clearance between the photovoltaic elements constituting the photovoltaic element string can be sufficiently ensured. This situation provides various advantages as follows. Even in the case of producing a solar cell module using a photovoltaic element string comprising a plurality of photovoltaic elements electrically connected with each other by the vacuum lamination method, air (including gas) present in the back face side of the photovoltaic element string can be effectively directed to flow toward the front face side of the photovoltaic element string not only through the peripheral portions of each of the photovoltaic elements but also through the clearances between the photovoltaic elements, where the air from the front face side of the photovoltaic element string is effectively evacuated through a nonwoven glass fiber member provided in the front face side of the photovoltaic element string. Hence, it is not necessary to arrange a nonwoven glass fiber member (502) under the back face of the photovoltaic element string as shown in FIG. 5 for the purpose of fostering the deaeration in the back face side. This situation enables to simplify the production process, resulting in a reduction in the production cost of a solar cell module.

Similarly, the foregoing decomposed residue as a gas of the organic peroxide which is generated under the photovoltaic element string in the thermocompression treatment can be effectively evacuated. In addition, by using a gas-permeable transparent film in the front face side of the photovoltaic element string, the gas generated can be permeated through the transparent film to flow to the outside.

In consequence, it is possible to effectively produce a solar cell module which contains neither ordinary air bubbles nor air bubbles based on the decomposed residue of the organic peroxide under the photovoltaic element string and which is free of the peeling between the photovoltaic elements and the back side filler resin found in the prior art, which can occur due to the air bubble when the solar cell module is exposed to a severe atmosphere with changes in the temperature and humidity. Thus, there can be attained a desirable solar cell module which excels in reliability.

(2). By making the ratio of B/A to be less than 0.045 as above described, the portions of the solar cell module which are corresponding to the clearances between the adjacent photovoltaic elements of the photovoltaic element string can be made have a sufficient rigidity. Thus, the solar cell module is not undesirably bent or curved when it is transported. And when the solar cell module is subjected to roll forming, the nonwoven glass fiber member enclosed in the filler resin does not suffer from the foregoing problems found in the prior art where the nonwoven glass fiber member is bulked to blanch or peeling occurs between the nonwoven glass fiber member and the filler resin. Thus, there can be attained a desirable solar cell module which excels in reliability.

Figure 1A:
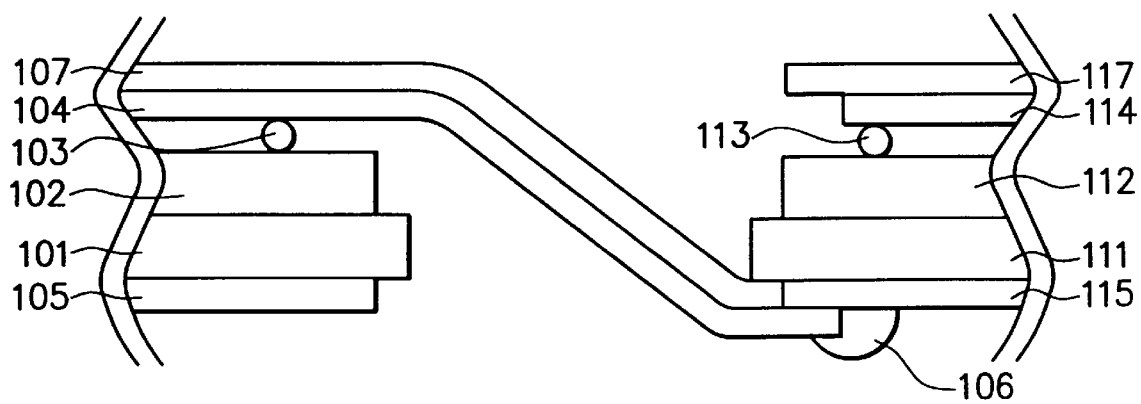
FIG. 1(a) is a schematic cross-sectional view illustrating an example of photovoltaic element string comprising a plurality of photovoltaic elements electrically connected in series in a solar cell module according to the present invention, in which a serialized portion of given adjacent photovoltaic elements is schematically shown.

(3). By making the step between each adjacent photovoltaic elements of the photovoltaic element string smaller than the thickness of the electric connection material, each of the serialized portions which becomes the most convex portion on the photovoltaic element string can be flattened. This situation enables to ensure the thickness of the transparent resin (the filler resin) at each of the serialized portions. Thus, even when the transparent resin should be decomposed when the solar cell module is continuously exposed to severe environments outdoors over a long period of time, the nonwoven glass fiber member enclosed in the transparent resin does not come up. Therefore, the reliability of the solar cell module is not decreased. In addition, by this, the amount of the resin used can be diminished, resulting in a reduction in the production cost of a solar cell module. Further, there are no problems previously described such as when the amount of the surface side filler resin used is increased, the resin becomes yellow to decrease the quantity of incident light which is impinged through the surface side coating resin to reach the photovoltaic elements whereby causing the reduction in the output power of the solar cell module and residual air bubble based on the decomposed residual as the gas component of the organic peroxide are caused. Further in addition, as shown in FIG. 1(a) [detailed description of which will be made later], the semiconductor element (111) cannot come into physical contact with the adjacent semiconductor element (101). In this connection, an edge portion of each photovoltaic element does not exert excessive stress on a metal foil material that serves as the electric connection material.

In addition to the above described advantages, the present invention also provides such significant various advantages as will be described below.

(4). By varying the thickness of the sealing material on the electric connection material connecting each adjacent photovoltaic element, there can be attained improved weatherability.

(5). By making the electric connection material to comprise a metal foil member whose surface is covered by an electrically insulating material, the metal foil member can be maintained while spaced from an end portion of each of the adjacent photovoltaic element, where the edge portion of each of the photovoltaic element never exerts excessive stress on the metal foil member. Therefore, the electric connection member thus constituted excels in reliability.

(6). By providing a terminal outputting member at each of the surface and the back face of each photovoltaic element, the area of the non-power generation region on the front side (the light receiving face side) of the photovoltaic element can be diminished. This enables to attain a solar cell module having a power generation region with a large occupied proportion in the light receiving face.

(7). By covering the front side (the light receiving face side) of the photovoltaic element string by laminating a transparent filler resin and a transparent film in this order, the solar cell module can be made that has a surface excelling in flexibility. In addition in this case, the transparent resin and the transparent film follow the irregularities present at the surface of each of the photovoltaic elements, and as a result, there can be ensured a desired thickness of the resin on each of the serialized portions. Further, by providing a reinforcing member comprising a metallic steel plate at the back face of the solar cell module, the solar cell module can be widely used as a roofing material by subjecting the solar cell module to, for example, roll forming.

In the following, the present invention will be detailed with reference to the drawings.

FIG. 1(a) is a schematic cross-sectional view illustrating an example of photovoltaic element string comprising a plurality of photovoltaic elements electrically connected in series in a solar cell module according to the present invention, in which a portion of given adjacent photovoltaic elements connected in series is schematically shown. The composition of each photovoltaic element in the photovoltaic element string shown in FIG. 1(a) is basically the same as that of the photovoltaic element shown in FIGS. 2(a) and 2(b).

In FIG. 1(a), each of reference numerals 101 and 111 indicates a semiconductor element, each of reference numerals 102 and 112 is an insulating adhesive body, each of reference numerals 103 and 113 is a collecting electrode, each of reference numerals 104 and 114 is a positive terminal member, each of reference numerals 105 and 115 is a negative terminal member, reference numeral 106 is a solder, and each of reference numerals 107 and 117 is an insulating tape.

Figure 1B:
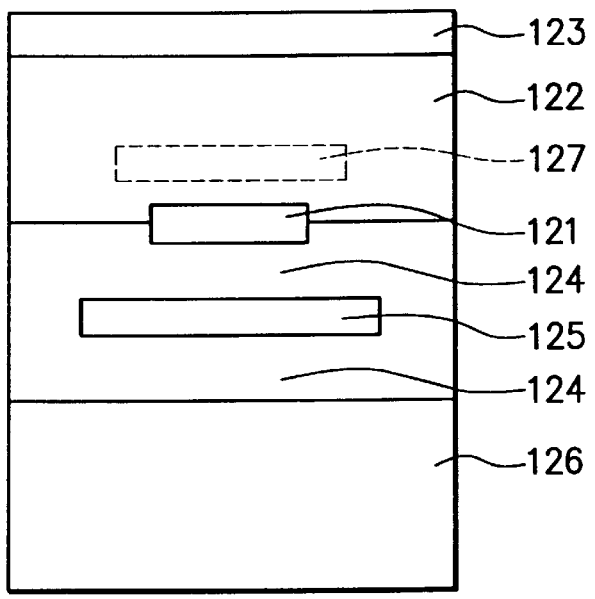
FIG. 1(b) is a schematic cross-sectional view illustrating an example of a solar cell module according to the present invention which is provided with a photovoltaic element, string having such configuration as shown in FIG. 1(a).

FIG. 1(b) is a schematic cross-sectional view illustrating an example of a solar cell module according to the present invention which is provided with a photovoltaic element string having a configuration as shown in FIG. 1(a).

In FIG. 1(b), reference numeral 121 indicates a photovoltaic element string, reference numeral 122 is a surface side filler resin comprising a transparent resin in which an inorganic fibrous material 127 is impregnated, reference numeral 123 is a surface protective film comprising a transparent film, reference numeral 124 is a back side filler resin, reference numeral 125 is an insulating film embedded in the back side filler resin 124, and reference numeral 126 is a reinforcing member.

In the case of the solar cell module shown in FIG. 1(b), incident light is impinged through the surface protective film 123, followed by reaching the photovoltaic element string, where an electromotive force is generated and is output an output terminal (not shown).

Each of the photovoltaic elements constituting the photovoltaic element string in the present invention typically comprises a semiconductor photoactive layer as a photoelectric conversion member and a transparent electrically conductive layer formed in this order on an electrically conductive substrate.

Figure 4:
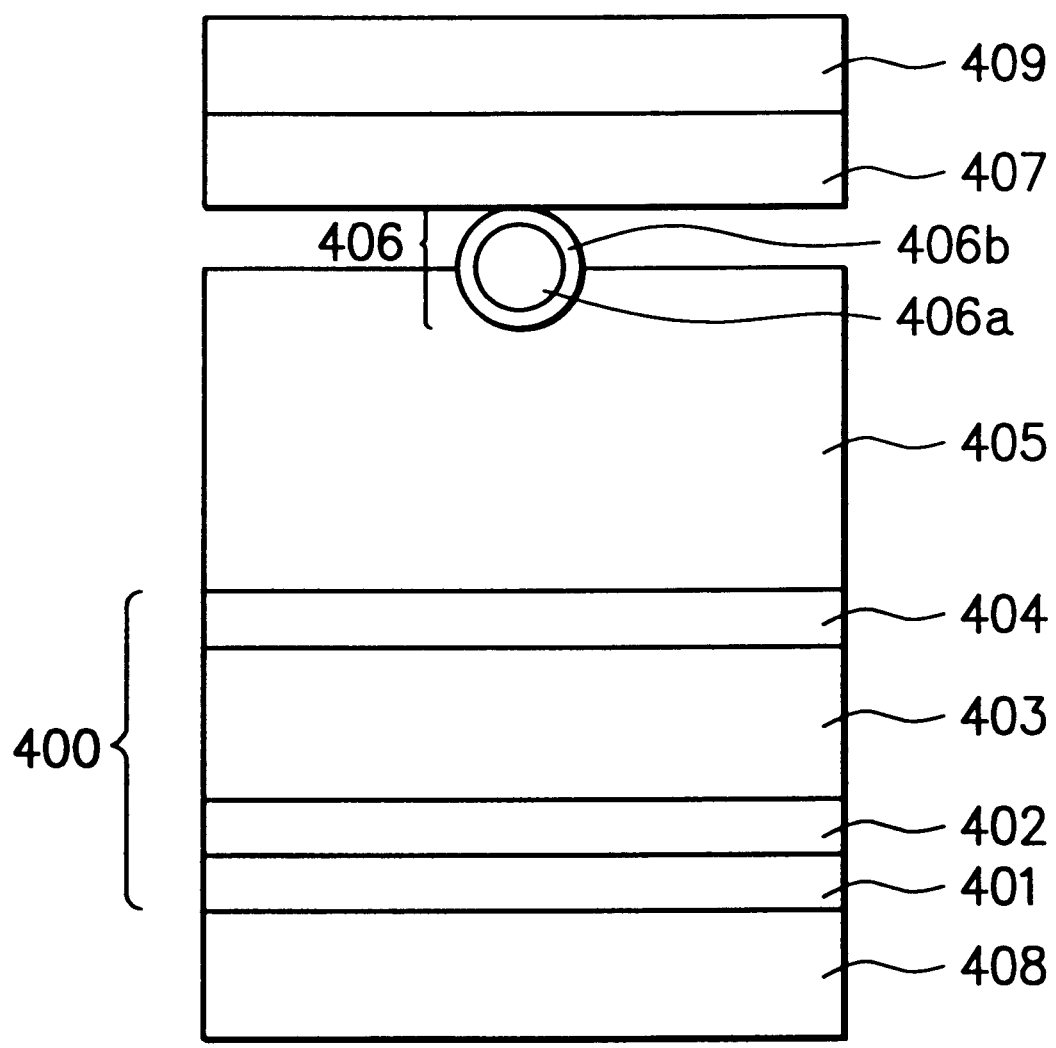
FIG. 4 is a schematic cross-sectional view illustrating an example of a terminal output portion of a photovoltaic element in the present invention.

FIG. 4 is a schematic cross-sectional view illustrating an example of the composition of such photovoltaic element. In FIG. 4, reference numeral 400 indicates a semiconductor element comprising a back reflecting layer 402, a semiconductor photoactive layer 403 and a transparent electrically conductive layer 404 stacked in this order on an electrically conductive substrate 401. Reference numeral 405 indicates an insulating adhesive body, reference numeral 406 is a collecting electrode (comprising a metallic wire 406a as a core which is covered by a coating layer 406b comprising an electrically conductive and adhesive material as a clad), reference numeral 407 is a positive terminal member, reference numeral 408 is a negative terminal member, and reference numeral 409 is an insulating tape.

In the following, a description will be made of each constituent of the photovoltaic element in the present invention with reference to FIG. 4.

Electrically Conductive Substrate 401

The electrically conductive substrate 401 serves not only as a substrate for the photovoltaic element but also as a lower electrode. For the electrically conductive substrate 401, there is no particular limitation as long as it has an electrically conductive surface. Specifically, it may be an electrically conductive member made of a metal such as Al, Cu, Ti, Ta, Mo, W, or the like or an alloy of these metals such as stainless steel. Besides, the electrically conductive substrate may comprise a carbon sheet or a Pb-plated steel sheet. Other than these, a film or sheet made of a synthetic resin whose surface having an electrically conductive layer formed thereon and a sheet made of a ceramic whose surface having an electrically conductive layer formed thereon are also usable as the electrically conductive substrate.

Back Reflecting Layer 402

The back reflecting layer 402 is provided on the electrically conductive substrate 401 in the case where it is necessary. The back reflecting layer may comprise a metal layer, a metal oxide layer, or a two-layered structure comprising a metal layer and a metal oxide layer.

The metal layer may be composed of a metal such as Ti, Cr, Mo, W, Al, Ag, Ni, or the like. The metal oxide layer may comprise a metal oxide such as ZnO, $TiO_2$, $SnO_2$, or the like.

Each of the metal layer and the metal oxide layer may be formed by a conventional film-forming technique such as resistance heating evaporation, electron beam evaporation, or sputtering.

Semiconductor Photoactive Layer 403

The semiconductor photoactive layer 403 functions to perform photoelectric conversion. The semiconductor photoactive layer may be composed of a non-single crystal silicon semiconductor material such as an amorphous silicon semiconductor material (including a microcrystalline silicon material) or polycrystalline silicon semiconductor material, or a compound semiconductor material. In any case, the semiconductor photoactive layer comprised of any of these semiconductor materials may be of a stacked structure with a pin junction, a pn junction or a Schottky type junction.

Specific examples of the compound semiconductor materials and junctions are $CuInSe_2$, $CuInS_2$, GaAs, $CdS/Cu_2S$, CdS/CdTe, CdS/InP, $CdTe/Cu_2Te$, and the like.

The semiconductor photoactive layer 403 comprised of any of the above mentioned semiconductor materials may be properly formed by a conventional film-forming technique. For instance, the semiconductor photoactive layer composed of an amorphous silicon semiconductor material may be formed by a conventional chemical vapor phase growing technique such as plasma CVD using a film-forming raw material gas capable of imparting silicon atoms, such as silane gas. The semiconductor photoactive layer composed of a polycrystalline silicon semiconductor material may be formed by a conventional polycrystalline silicon film-forming method of providing a fused silicon material and subjecting the fused silicon material to film-making processing or another conventional polycrystalline silicon film-forming method of subjecting an amorphous silicon material to heat treatment.

The semiconductor photoactive layer 403 composed of any of the above mentioned compound semiconductor materials may be formed by conventional ion plating, ion beam deposition, vacuum evaporation, sputtering, or electrolytic technique in which a precipitate is formed by way of electrolysis of a desired electrolyte.

Transparent Electrically Conductive Layer 404

The transparent electrically conductive layer 404 functions as a transparent upper electrode. The transparent electrically conductive layer may comprise $In_2O_3$, $SnO_2$, ITO ($In_2O_3$—$SnO_2$), ZnO, $TiO_2$, or $Cd_2SnO_4$. Besides these, it may comprise a crystalline semiconductor layer doped with an appropriate impurity at a high concentration.

The transparent electrically conductive layer 404 comprising any of the above mentioned materials may be formed by conventional resistance heating evaporation, sputtering, spraying, or CVD.

The above described impurity-doped crystalline semiconductor layer as the transparent electrically conductive layer 404 may be formed by a conventional impurity-diffusion film-forming method.

Insulating Adhesive Body 405

The insulating adhesive body 405 comprises a laminate comprising an organic polymer film whose opposite surfaces having an adhesive material laminated thereon. The adhesive material can include an acrylic adhesive material, a rubber series adhesive material, a silicone series adhesive material, and a polyvinyl ether series adhesive material. Of these, acrylic adhesive material and silicone series adhesive material are particularly preferable because they excel in heat resistance, durability and holding power. The organic polymer film is used for the purpose of protecting the photovoltaic element from being damaged by heat from a solder when it is subjected to soldering or burr or fracture of the positive terminal member. As the constituent organic polymer of the organic polymer film, there can be mentioned, for example, cellophane, rayon, acetate, polyethylene, polyethylene terephthalate, polyether ketone, fluororesin, polysulfone, polyamide, polyimide, and polyimideamide. Of these, polyetylene terephthalate and polyimide are particularly preferred because they excel in adhesion with the adhesive material and physical strength and are small in thermal expansion. The organic polymer film may comprise a laminate comprising films made of these polymers.

Collecting Electrode 406

Figure 2A:
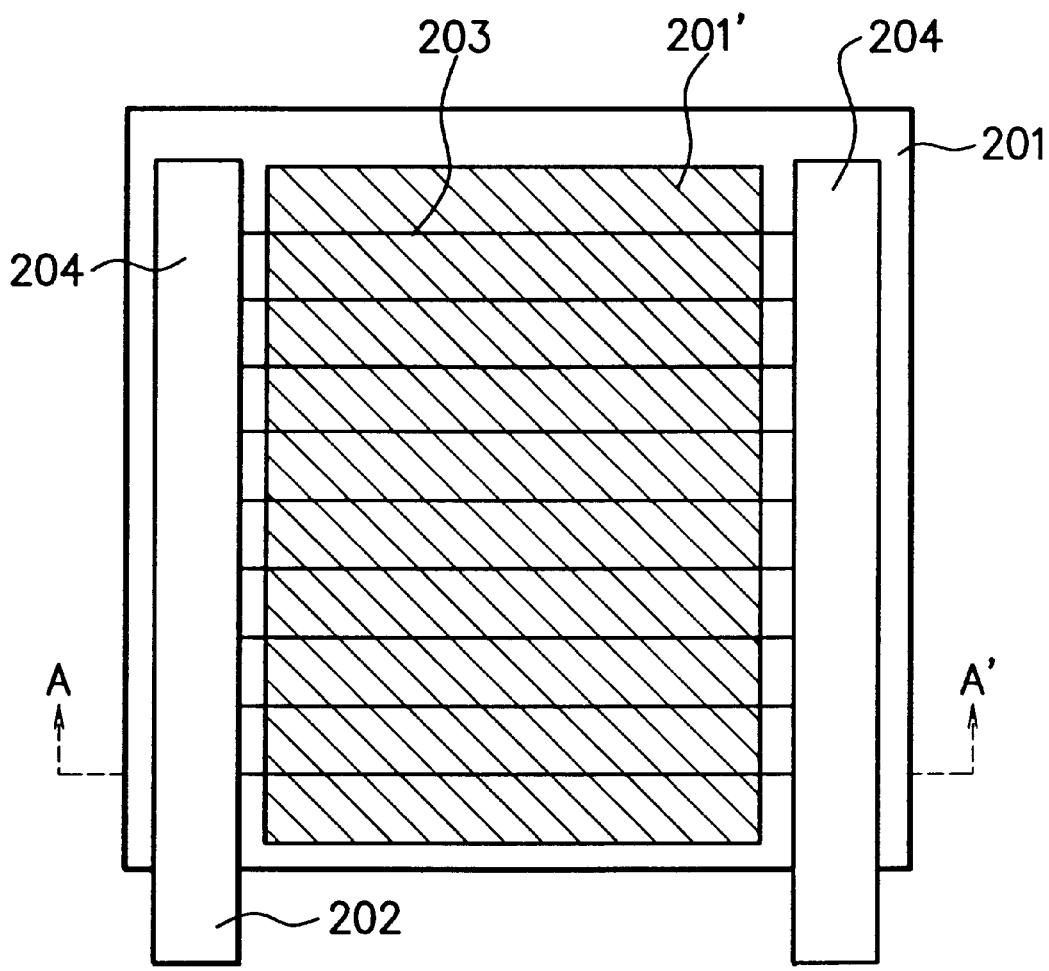
FIG. 2(a) is a plan view illustrating an example of a conventional photovoltaic element.
Figure 2B:
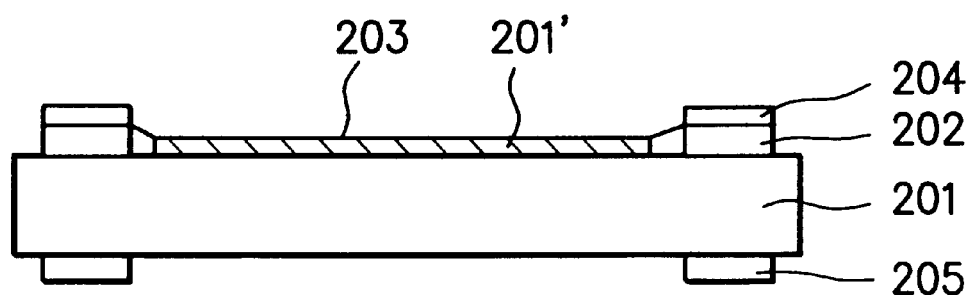
FIG. 2(b) is a schematic cross-sectional view, taken along the A—A' line in FIG. 2(a).
Figure 3:
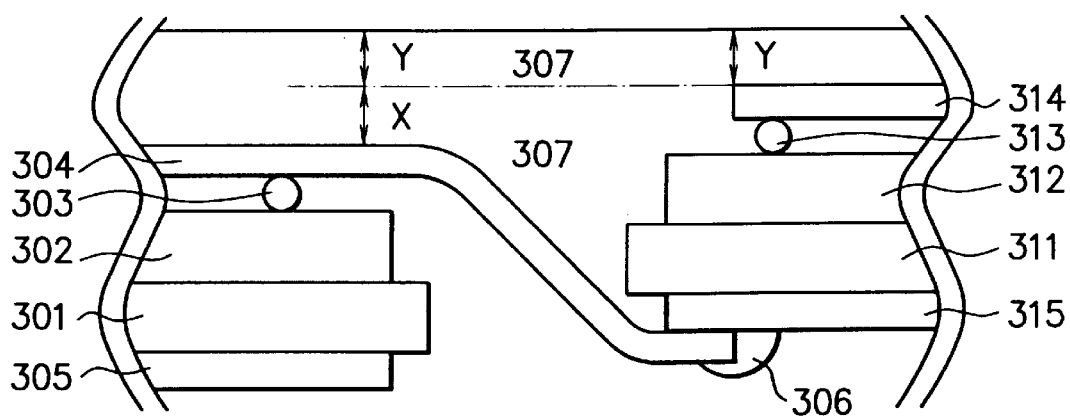
FIG. 3 is a schematic cross-sectional view illustrating an example of a portion of a conventional photovoltaic element string connected in series.

The collecting electrode 406 is arranged on the transparent electrically conductive layer 404 as the transparent upper electrode, for instance, as shown in FIG. 2(a), for the purpose of effectively collecting an electric current generated by virtue of a photoelectromotive force. Typically, as above described, the collecting electrode 406 comprises a metallic wire 406a as a core whose surface is covered by a coating layer 406b comprising an electrically conductive and adhesive material as a clad. This collecting electrode may be obtained by providing a metallic wire 406a made of a metal such as Al, Ag, Au, Ni, Cu, Sn or Pt which has a resistivity of less than $10^{-4}$ Ω cm, and coating the surface of the metallic wire 406a by a paste 406b obtained by dispersing particles of an electrically conductive material in a binder resin. The thickness of the coating layer 406b is desired to be in a range of 1 to 100 μm, preferably in a range of 1 to 50 μm, for the following reasons. When the thickness is less than 1 μm, the adhesion of the collecting electrode which is bonded to the transparent upper electrode becomes insufficient, and when the thickness is beyond 100 μm, the surface area of the transparent electrode which is shaded by the collecting electrode becomes excessively large to diminish the quantity of light impinged to the semiconductor photoactive layer, resulting in a decrease in the power outputted.

Positive and Negative Terminal Members 407 and 408

The positive terminal member 407 and the negative terminal member 408 serve to output an electromotive force. Each of the positive terminal member 407 and the negative terminal member 408 is formed of a metal or an alloy which are low in resistivity. Specific examples of such metal are Cu, Ag, Au, Pt, Al, Sn, Pd, and Ni. Specific examples of such alloy follow.

If necessary, it is possible to form a thin surface metal layer on the surface of each of the positive terminal member 407 and the negative terminal member 408, for the purposes of corrosion prevention, oxidation prevention, improvement of adhesion with an electrically conductive resin, and improvement of electric continuity. Alternatively, it is possible that an electrically conductive paste is applied to at least a portion of each of these terminal members and is electrically connected with a metal wire.

Each of the positive terminal member 407 and the negative terminal member 408 may be shaped in a belt-like foil body form or in a wire form.

Insulating Tape 409

The insulating tape 409 comprises a laminate comprising an insulating organic polymer film as a base member and an adhesive material. Particularly, the insulating organic film base member is provided with the adhesive material to be arranged on the positive terminal member The adhesive material can include an acrylic adhesive material, a rubber series adhesive material, a silicone series adhesive material, and a polyvinyl ether series adhesive material. Of these, an acrylic adhesive material and a silicone series adhesive material are particularly preferable because they excel in heat resistance, durability and holding power. As the constituent organic polymer of the organic polymer film, for example, cellophane, rayon, acetate, polyethylene, polyethylene terephthalate, polyether ketone, fluororesin, polysulfone, polyamide, polyimide, and polyimideamide Of these, polyetylene terephthalate and polyimide are particularly preferred because they excel in adhesion with the adhesive material and physical strength and are small in thermal expansion. The organic polymer film may comprise these polymers.

In the following, a description will be made of lamination materials used in a solar cell module of the present invention while referring to FIG. 1(b).

Surface Side Filler Resin 122

The surface side filler resin 122 comprising a transparent resin is necessary in order to cover the irregularities at the light receiving faces of the photovoltaic elements of the photovoltaic element string 121 while preventing the photovoltaic elements from being influenced by external factors such as temperature changes and/or humidity changes in the external environment, external impacts, and the like and allowing a sufficient quantity of light to pass through to reach the photovoltaic elements, and also in order to ensure the adhesion between the photovoltaic element string 121 and the surface protective film 123. Hence, the surface side filler resin 122 should have excellent transparency, weatherability, adhesion, packing property, heat resistance, cold resistance, and impact resistance. In order to satisfy these requirements, the transparent resin should preferably comprise a transparent thermoplastic resin. Such thermoplastic resins include polyolefinic resins such as EVA (ethylene-vinyl acetate copolymer), EMA (ethylene-methyl acrylate copolymer), EEA (ethylene-ethyl acrylate copolymer), and silicone resins. Of these, EVA is particularly preferable because it exhibits well-balanced properties when used in a solar cell module.

EVA'S deformation temperature is low, and EVA readily deforms or creeps when it is used at high temperature. Therefore EVA is usually crosslinked by an organic peroxide crosslinking agent. The crosslinking of the EVA by the organic peroxide is performed by removing hydrogen atoms in the resin by virtue of free radicals generated from the organic peroxide to form C—C bonds. The activation of the organic peroxide may be conducted by thermal decomposition, redox decomposition or ion decomposition. In general, the activation of the organic peroxide is desirably conducted by thermal decomposition.

The amount of the organic peroxide crosslinking agent to be added to the transparent resin as the surface side filler is preferred to be in a range of 0.5 to 5 parts by weight versus 100 parts by weight of the transparent resin. It is possible that the organic peroxide crosslinking agent is used together with the transparent resin, followed by subjecting the transparent resin to thermocompression bonding while crosslinked by the organic peroxide. The temperature and the period of time for the termocompression bonding treatment in this case may be determined depending on the thermodecomposition temperature property of a given organic peroxide crosslinking agent. However, in general, these conditions are determined to be such that the thermocompression bonding treatment of the transparent resin is considered to be terminated when 90% or more or preferably, 95% or more of the organic peroxide in the transparent resin is thermally decomposed.

The crosslinked degree of the transparent resin can be examined by observing the gel fraction in the transparent resin. The transparent resin as the surface side filler is desired to have a get fraction of 80% or more. The gel fraction herein can be obtained in accordance with the following equation.

Gel fraction=(the weight of an undissolved component/the original weight of a starting specimen)×100 (%)

Specifically, in the case where a given transparent resin which has been crosslinked by a given organic peroxide is extracted by a solvent such as xylene, a crosslinked and gelated portion portion thereof is not eluted but only a non-crossllnked sol portion thereof is eluted. A material having a gel fraction of 100% is a material that has been completely crosslinked. After the extraction, by taking out the remaining specimen and evaporating the xylene, only a undissolved gel component can be obtained.

When the gel fraction of the transparent resin is less than 70%, the transparent resin is inferior in heat resistance and creep resistance, and because of this, its use is problematic at high temperature, for instance, in the summer.

In order to efficiently crosslink the transparent resin, it is preferable to use a so-called crosslinking assistant such as triarylisocyanurate (TAIC) in addition to the crosslinking agent. In this case, the amount of the crosslinking assistant to be added is generally in an range of 1 to 5 parts by weight versus 100 parts by weight of the surface side filler resin. When EVA is used as the surface side filler resin, the content of the vinyl acetate in the EVA is preferably to be in an range of 20 to 30%. In the case of using EVA whose vinyl acetate content is less than 20% and whose crosslinking efficiency is the same as that of the above EVA, the crosslinking density becomes high. Because of this, the surface side filler becomes very rigid so that it is inferior in flexibility. Similarly, using EVA whose vinyl acetate content is greater than 30%, the surface side filler becomes excessively soft so that crinkling and the like is likely to occur in the recessed portions thereof.

The transparent resin used as the surface side filler resin 122 in the present invention is satisfactory in weatherability. However, in order for the transparent resin to have a further improved weatherability, it is possible to incorporate an appropriate UV absorber in the transparent resin. As such an UV absorber, conventional compounds which are known as the UV absorber can be optionally used. But in view of the use environment for the solar cell module, it is preferred to use UV absorbers having a low volatility. The amount of the UV absorber to be added is preferably in a range of 0.1 to 3 parts by weight or more preferably, in a range of 0.25 to 1 part by weight, versus 100 parts by weight of the transparent resin.

When a photo stabilizer is incorporated in the transparent resin together with such an UV absorber, the transparent resin becomes more stable against light.

As the method of enhancing weatherability, it is known to use a hindered amine series photo stabilizer. The hindered amine series photo stabilizer does not absorb ultraviolet rays as the UV absorber does. But when the hindered amine series photo stabilizer is used together with the UV absorber, a pronounced synergistic effect is provided.

The amount of the hindered amine series photo stabilizer to be added is preferably in a range of 0.1 to 3 parts by weight or more preferably, in a range of 0.25 to 1 part by weight, versus 100 parts by weight of the transparent resin.

There are also photo stabilizers other than the hindered amine series photo stabilizer, but those photo stabilizers are not desirable to be used in the transparent resin utilized as the surface side filler because they are mostly colored.

When the solar cell module is used in severer environmental conditions, it is preferred that not only the adhesion between the transparent resin 122 and the photovoltaic element string 121 but also the adhesion between the transparent resin 122 and the surface protective transparent film 123 is improved. This purpose can be achieved by incorporating a silane coupling agent or an organic titanate in the transparent resin. The amount of each of the silane coupling agent and the organic titanate to be added is preferably in a range of 0.1 to 3 parts by weight or more preferably, in a range of 0.25 to 1 part by weight, versus 100 parts by weight of the transparent resin.

Further, the incorporation of the silane coupling agent or the organic titanate in the transparent resin is also effective in improving the adhesion between the transparent resin 122 and the inorganic fibrous material 127 (comprising a non-woven glass fiber) impregnated in the transparent resin.

Now, in order to prevent a decrease in the quantity of incident light that reaches the photovoltaic element string 121, the surface side filler comprising the transparent resin is required to be substantially transparent. Specifically, the surface side filler should have a transmittance of preferably 80% or more, or more preferably, 90% or more in a visible light wavelength region of 400 nm to 800 nm. Further, in order to facilitate external light to be readily impinged to reach the photovoltaic element string, the surface side filler should have a refractive index preferably in a range of 1.1 to 2.0 or more preferably, a range of 1.1 to 1.6 at a temperature of 25° C.

Surface Protective Film 123

The surface protective film 123 comprising the transparent film is situated at the outermost surface of the solar cell module, and therefore, it is required to have excellent weatherability, pollution resistance and physical strength. In addition, when the solar cell module is used in severe environmental conditions outdoors, the surface protective film is required to be such that it ensures the solar cell module to have sufficient enough durability upon repeated use over a long period of time. In view of this, the transparent film should preferably to be composed of fluororesin or acrylic resin. Of these resins, fluororesin is the most appropriate because it has excellent weatherability and pollution resistance. Specific preferable examples of the fluororesin are polyvinylidene fluoride resin, polyvinyl fluoride, and ethylene tetrafluoride-ethylene copolymer. Of these, polyvinylidene fluoride excels in weatherability, and ethylene tetrafluoride-ethylene copolymer excels in both weatherability and physical strength.

In order to attain an improved adhesion for the transparent film used as the surface protective film 123 with the surface side filler 122 comprising the transparent resin, it is preferred that the surface of the transparent film in contact with the transparent resin is subjected to a surface treatment such as a corona discharging treatment, an plasma treatment, an ozone treatment, a UV-ray irradiation treatment, an electron beam irradiation treatment, and a flame treatment. Particularly, the surface of the transparent film used as the surface protective film 123 which is in contact with the transparent resin used as the surface side filler 122 is should preferably have a wetting index in a range of 34 to 45 dyne/cm. When the wetting index is less than 34 dyne/cm, the adhesion between the transparent film and the transparent resin is not sufficient enough, and peeling is likely to occur at the interface between the transparent film and the transparent resin.

Incidentally, when a resin film made of ethylene tetrafluoride-ethylene copolymer is used as the transparent film, it is difficult to make the resin film that has a surface with a wetting index which is greater than 45 dyne/cm.

Separately, when an oriented transparent resin film is used as the surface protective film 123, the oriented transparent resin film crack. Particularly, if a solar cell module whose surface protective film comprises such an oriented transparent resin film, is subjected to processing that bends the end portions thereof, problems are likely to occur in that the film is broken at the bent portions, where the covering material situated in such film broken portion is peeled resulting in moisture penetration and as a result, the solar cell module becomes inferior in terms of the reliability.

Hence, the transparent resin film used as the surface protective film should preferably comprise a non-oriented transparent resin film. Particularly, it is preferred to use a non-oriented transparent resin film having a tensile-elongation after fracture in an range of 200 to 800% with in lengthwise and crosswise in ASTMD-882 test in JIS.

Insulating Film 125

The insulating film 125 is used for the purpose of electrically isolating the electrically conductive substrates of the photovoltaic elements constituting the photovoltaic element string 121 from the outside.

The insulating film should preferably be composed of a material capable of sufficiently electrically isolating the electrically conductive substrates as described above and which has excellent durability, can withstand thermal expansion and thermal contraction, and has excellent flexibility. Specific examples of such material are nylon, polyethylene terephthalate, polycarbonate, and the like.

Back Side Filler Resin 124

The backside filler resin 124 serves to ensure the adhesion between the photovoltaic element string 121 and the insulating film 125. The backside filler resin 124 should preferably comprise a resin material capable of ensuring sufficient adhesion with the electrically conductive substrates of the photovoltaic elements constituting the photovoltaic element string and which has excellent durability, can withstand thermal expansion and thermal contraction, and has execellent flexibility.

Specific examples of such resin material are hot-melt resin materials such as EVA (ethylene-vinyl acetate copolymer), EMA (ethylene-methyl acrylate copolymer), EEA (ethylene-ethyl acrylate copolymer), polyethylene, polyvinyl butyral, and the like. Double-coated tapes and epoxy adhesives having flexibility are also usable. In order to improve the adhesion with the reinforcing member and the insulating film, these an appropriate tackifier resin may be applied to their surface.

The resin used as the back side filler resin 124 may comprise the same transparent resin used as the surface side filler resin 122.

In order to simplify the process of producing a solar cell module, it is possible to use a laminate comprising the foregoing insulating film having a layer composed of any of the above mentioned resins as the back side filler resin laminated on each of the opposite faces.

Further, as the above mentioned back side filler resins have a low heat deformation temperature, they readily deform or creep at high temperature. It is preferable for them to be crosslinked by a crosslinking agent comprising an organic peroxide or the like to improved heat resistance, as well as for the of the transparent resin used as the surface side filler resin 122.

Reinforcing Member 126

The reinforcing member 126 is provided at the back face of the solar cell module in order to improve the mechanical strength of the solar cell module and in order prevent the solar cell module from being distorted or warped due to changes in the environmental temperature, and also in order to make the solar cell module a roofing material integral type solar cell.

The reinforcing member may comprise a galvanized steel plate covered by an organic polymer resin with excellent weatherability and corrosion resistance, a plastic plate or a fiber-glass reinforced plastic plate (or a so-called ERP plate).

Inorganic Fibrous Material 127

The following is a description of the inorganic fibrous material 127 impregnated in the transparent resin used as the surface side filler resin 122.

The inorganic fibrous material is impregnated in the transparent resin mainly for the following reasons. A solar cell module, especially for a solar cell module which is installed on a roof or a wall of a building, is required to be incombustible. When the amount of the polymer resin used is large, the solar cell module becomes combustible, but when said amount is small, it becomes difficult to protect the photovoltaic elements in the solar cell module from the external environment, including an externally applied impact. Thus, in order to sufficiently protect the photovoltaic elements in the solar cell module from the external while employing a small amount of the organic polymer resin, such transparent resin 122 as described above in which a given inorganic fibrous material 127 is impregnated, is used as the front side covering material in the solar cell module.

The inorganic fibrous material 127 can include, for example, nonwoven glass fiber members, woven glass fiber members, glass fillers, and the like. Of these, nonwoven glass fiber members are the most appropriate because they can be acquired at a reasonable cost and they are readily impregnated in the transparent resin. Woven glass fiber members are costly and difficult to impregnate in the transparent resin. Glass fillers, do not substantially contribute to an improvement in the scratch resistance of the solar cell module. In addition, when using a given glass filler, there is a problem in that the photovoltaic elements cannot be sufficiently covered by a small amount of the transparent resin.

In order to ensure sufficient adhesion of the inorganic fibrous material 127 with the transparent resin, it is preferred that prior to using the inorganic fibrous material, it is treated with a silane coupling agent or an organic titanate just as the transparent resin.

The following will describe a method of preparing a photovoltaic element string by connecting in series a plurality of photovoltaic elements as shown in FIG. 1(a) and a process of producing a solar cell module having such configuration as shown in FIG. 1(b) using said photovoltaic element string by a vacuum lamination method Preparation of Photovoltaic Element String A plurality of photovoltaic element is provided. These photovoltaic elements are arranged on a jig such that their back faces are faced downward, where they are electrically connected in series as shown in FIG. 1(a). In FIG. 1(a), for the simplification purpose, only two photovoltaic elements which are electrically connected in series are shown. Here, a description will be made of the electrical serialization of the photovoltaic elements with reference to FIG. 1(a) . As shown in FIG. 1(a) the positive terminal member 104 of one photovoltaic element (positioned on the left side in the figure) is electrically connected to the negative terminal member 115 of the other photovoltaic element (positioned on the right side in the figure) so as to have a desired clearance between the two photovoltaic elements. Thus, all the photovoltaic elements are electrically connected in series. By this, a photovoltaic element string can be obtained.

Figure 10:
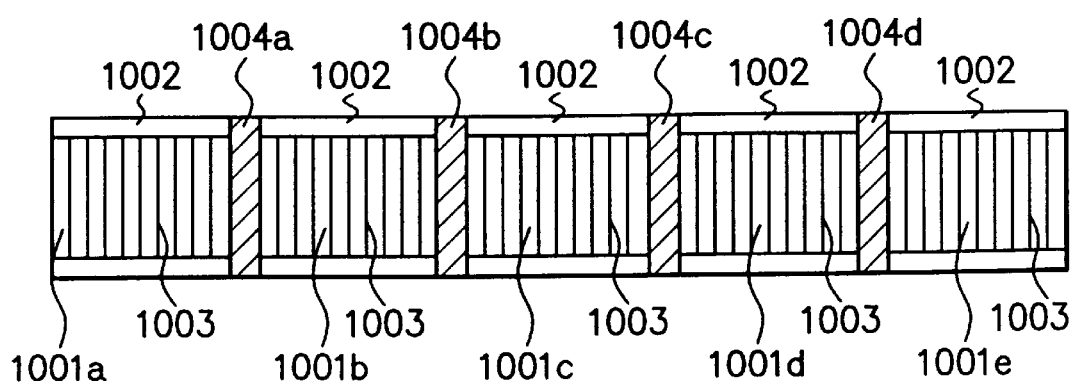
FIG. 10 is a schematic view illustrating another example of a solar cell string in the present invention.

FIG. 10 is a schematic plan view illustrating an example of a photovoltaic element string obtained in the above described manner. FIG. 10 schematically shows a light receiving face side of said photovoltaic element string. In FIG. 10, each of the reference numerals 1001a to 1001e indicates a photovoltaic element. Reference numeral 1002 indicates a positive terminal member, and reference numeral 1003 indicates a collecting electrode. Each of reference numeral 1004a to 1004d indicates a clearance between each adjacent photovoltaic element.

In the photovoltaic element string shown in FIG. 10, each adjacent photovoltaic elements (1001a, 1001b, 1001c, 1001d, 1001e) connected in series by electrically connecting the positive terminal member 1002 of one photovoltaic element to a negative terminal member (not shown) of the other photovoltaic element while having a clearance (1004a, 1004b, 1004c, 1004d) between the two photovoltaic elements. Each of the photovoltaic elements 1001a to 1001e has a specific area A in terms of the horizontal cross section. Similarly, each of the clearances 1004a to 1004d has a specific area in terms of the horizontal cross section.

Here, a description will be made of the foregoing term B in FIG. 10. For instance, with respect to the three photovoltaic elements 1001a to 1001c, each of the photovoltaic elements 1001a and 1001c is positioned next to the photovoltaic element 1001b. The term B in this case means a sum of the area of the clearance 1004a and the area of the clearance 1004b.

Now, as the area of each clearance (1004a, 1004b, 1004c, 1004d) is increased, the step between each adjacent photovoltaic elements (1001a, 1001b, 1001c, 1001d, 1001e) is relaxed accordingly, and the deaeration effect when the photovoltaic element is subjected to vacuum lamination treatment in order to produce a solar cell module is enhanced. But there is a shortcoming in this case in that the loading proportion of the photovoltaic elements to a solar cell module is undesirably lowered. In addition, such problems as will be described can possibly occur. That is, the portion between each adjacent photovoltaic elements is apparently inferior to the photovoltaic element portions in terms of the rigidity and therefore, the portion can possibly fracture or curve. Because of this, a solar cell module produced using such photovoltaic element string can experience peeling between the transparent resin and the inorganic fibrous material which are situated between the photovoltaic elements, where the transparent resin is blanched.

In order to effectively prevent such problems as described above from occurring, the interrelation between the area A of one (a) of the photovoltaic elements and the sum B of the areas of the clearances between the photovoltaic element (a) and the photovoltaic elements (b) positioned next to the photovoltaic element (a) is such that the ratio of B/A is in an range of 0.003 to 0.045

Production of Solar Cell Module

The production of a solar cell module using such photovoltaic element string as above described in accordance with the vacuum lamination method may be conducted, for instance, in the following manner.

On a mounting plate of a laminater of the double vacuum system, a reinforcing member, a back side film, an insulating film and a back side resin sheet are stacked in this order. Then, the photovoltaic element string is stacked on the back side resin sheet so that its light receiving face side is faced downward, followed by stacking an inorganic fibrous material member, a transparent resin sheet, and a transparent film in this order. By this, a stacked body on the mounting plate of the laminator is formed. Then, a release sheet comprising, for instance, a Teflon-coated fiber sheet (having a thickness of 0.2 mm) having a good releasing property and a silicone rubber sheet (having a thickness of 2 mm) are superposed over the stacked body to seal the stacked body between the mounting plate and the cover comprising the Teflon-coated fiber sheet and the silicone rubber sheet (the resultant herein will be hereinafter referred to as air bag system). Thereafter, the inside of the air bag system containing the stacked body therein is evacuated to a desired vacuum pressure, for instance, of 2.1 Torr for a desired period of time, for instance, 30 minutes by a vacuum pump. While continuing the evacuation of the inside of the air bag system by the vacuum pump, the air bag system is introduced into an oven at a temperature of 160° C. so that the crosslinking reaction of the resins in the stacked upon thermocompression bonding treatment can efficiently proceed and be completed within a predetermined period of time, for instance, 50 minutes. After this, the air bag system is taken out from the oven, and still under reduced pressure, the stacked body in the air bag system is cooled. Thereafter, the stacked body is taken out from the vacuum laminater. Thus, a solar cell module is obtained.

A pair of power output terminals (not shown) of the photovoltaic element string are drawn through a terminal drawing hole formed in the reinforcing member in advance.

The present invention will be described in more detail with reference to examples by the following. It should be understood that these examples are only for illustrative purposes and are not intended to restrict the scope of the present invention.

EXAMPLE 1

In this example, a plurality of photovoltaic elements having such configuration as shown in FIG. 4 were prepared, a photovoltaic element string comprising said photovoltaic elements was prepared, and a solar cell module comprising said photovoltaic element string was prepared, as will be described below.

Preparation of Collecting Electrode

There was prepared a collecting electrode comprising a metal wire whose surface is coated by an electrically conductive resin material in the following manner.

A mixed solvent composed of 2.5 g of ethyl acetate and 2.5 g of isopropyl alcohol was introduced into a dispersion shake bottle Then, 22.0 g urethane resin was introduced into the shake bottle, and followed by sufficiently stirring the contents in the shake bottle by a ball mill, whereby the urethane resin was dissolved in the mixed solvent to obtain an urethane resin solution in the shake bottle. Thereafter, 1.1 g of blocked isocyanate and 10 g of dispersing glass beads were added to the urethane resin solution in the shake bottle, followed by adding 2.5 g of powdery carbon black having an average particle size of 0.05 $\mu$m. After this, the shake bottle containing those added materials together with the urethane resin solution was shaken by a paint shaker (produced by Tohyoseiki Seisakusho Kabushiki Kaisha) for 10 hours, whereby the materials were dispersed in the urethane resin solution. The glass beads were taken out from the resulting solution. Thus, an electrically conductive resin paste was obtained.

Then, using a wire coating machine provided with a coater, a copper wire was coated by the electrically conductive resin paste in the following manner.

A pay-out reel having a long copper wire wound thereon was arranged in the coating machine, where the copperwire was delivered from the pay-out reel, and the tip of the copper wire was fixed to the take-up reel such that the copper wire was tensioned between the two reels. The copper wire on the pay-out was delivered by rotating the take-up reel while being taken up by and wound on the take-up reel, wherein the electrically conductive resin paste was continuously poured into the coater, whereby the copper wire moving from the pay-out reel toward the take-up reel was continuously coated by the electrically conductive resin paste. In this case, the coat comprising the electrically conductive resin paste on the copper wire was dried before the coated copper wire was taken up by and wound on the take-up reel.

Thus, a long collecting electrode having a double structure comprising the copper wire as a core and the electrically conductive resin material as a clad was obtained.

Preparation of Semiconductor Element

A semiconductor element 400 (see, FIG. 4) was prepared in the following manner.

There was provided a well cleaned stainless steel plate of 356 mm×239 mm in size as the electrically conductive substrate 401. On the surface of the stainless steel substrate 401, there was formed a two-layered back reflecting layer 402 comprising a 5000 Å thick Al film/a 5000 Å thick ZnO film by a conventional sputtering method.

On the back reflecting layer 402, in accordance with a conventional plasma CVD film-forming method, there was formed a tandem type a-Si semiconductor photoactive layer 403 comprising a 150 Å thick n-type layer comprising an amorphous silicon (a-Si) material/a 4000 Å thick i-type layer comprising an a-Si material/a 100 Å thick p-type layer comprising a microcrystalline silicon (μc-Si) material/a 100 Å thick n-type layer comprising an a-Si material/a 800 Å thick i-type layer comprising an a-Si material/a 100 Å thick p-type layer comprising a μc-Si material being stacked in the named order from the substrate side, where each n-type layer was formed from a gaseous mixture comprising $SiH_4$, $PH_3$ and $H_2$; each i-type layer was formed a gaseous mixture comprising $SiH_4$ and $H_2$; and each p-type layer was formed from a gaseous mixture comprising $SiH_4$, $BF_3$ and $H_2$.

Then, on semiconductor photoactive layer 403, there was formed a 700 Å thick transparent electrically conductive layer 404 composed of $In_2O_3$ by a conventional heat resistance evaporation method wherein an In source was evaporated in an $O_2$ atmosphere.

Thus, a semiconductor element 400 was obtained.

Preparation of Photovoltaic Element

Using the semiconductor element 400 obtained in the above, a photovoltaic element was prepared in the following manner.

(1). With respect to the light receiving face side of the semiconductor element 400 (of 356 mm×239 mm in size), using an etching paste containing ferric chloride as a main component and a conventional screen printing machine, a peripheral portion of the transparent electrically conductive layer 404 was removed to form a power generation region having an area of 800 cm². By this, there were formed said power generation region based on the transparent electrically conductive layer 404 and a non-power generation region situated in the peripheral portion outside the power generation region (these are not shown in FIG. 4) on the light receiving face side of the semiconductor element 400. This situation is the same as that in the previously described case shown in FIGS. 2(*a*) and 2(*b*).

(2). At the back face of the semiconductor element 400 (that is, at the back face of the electrically conductive substrate 401), a 100 μm thick rigid copper foil as the negative terminal member 408 was laser-welded.

(3). On each of the opposite non-power generation regions on the light receiving face side of the semiconductor element 400, a laminate comprising a 50 μm thick polyimide layer/a 25 μm thick silicone adhesive layer/a 75 μm thick polyethylene trephthalate layer/a 50 μm thick silicone adhesive layer as the insulating adhesive body 405 was arranged so that the polyimide layer of the laminate was in contact with the surface of the non-power generation region.

(4). The long collecting electrode obtained in the above preparation of collecting electrode was cut to obtain a plurality of collecting electrodes 406 of equal length. These collecting electrodes 406 were spaced at an equal interval of 5.5 mm on the light receiving face side of the semiconductor element 400 such that they were tensioned over the power generation region while in contact with the surface of the power generation region, and their opposite end portions were fixed to the insulating adhesive body 405 provided on each of the non-power generation regions on the light receiving face side of the semiconductor element 400, as shown in FIG. 2(*b*).

(5). A positive terminal member 407 comprising a 100 m thick Ag-claded rigid copper foil was arranged on each insulating adhesive body on which the end portions of the collecting electrodes are fixed.

(6). In order for the collecting electrodes 406 and the positive terminal member 407 to be better bonded through the insulating adhesive body 405, the portions each having the collecting electrodes 406 and the positive terminal member 407 arranged on the insulating adhesive body were subjected to thermocompression bonding treatment at 200° C. and at a pressure of 5 Kg/cm² for 15 seconds.

(7). A laminate comprising a 100 μm thick black-colored polyethylene terephthalate film/a 30 μm thick acrylic adhesive layer as the insulating tape 409 was laminated on each positive terminal member 407 through the acrylic adhesive layer of the laminate.

Thus, there was obtained a photovoltaic element having such configuration as shown in FIG. 4 and having an area of 356 mm×239 mm.

The above procedures of preparing the photovoltaic element were repeated 30% times to obtain 30 photovoltaic elements.

Preparation of Photovoltaic Element String

Figure 9:
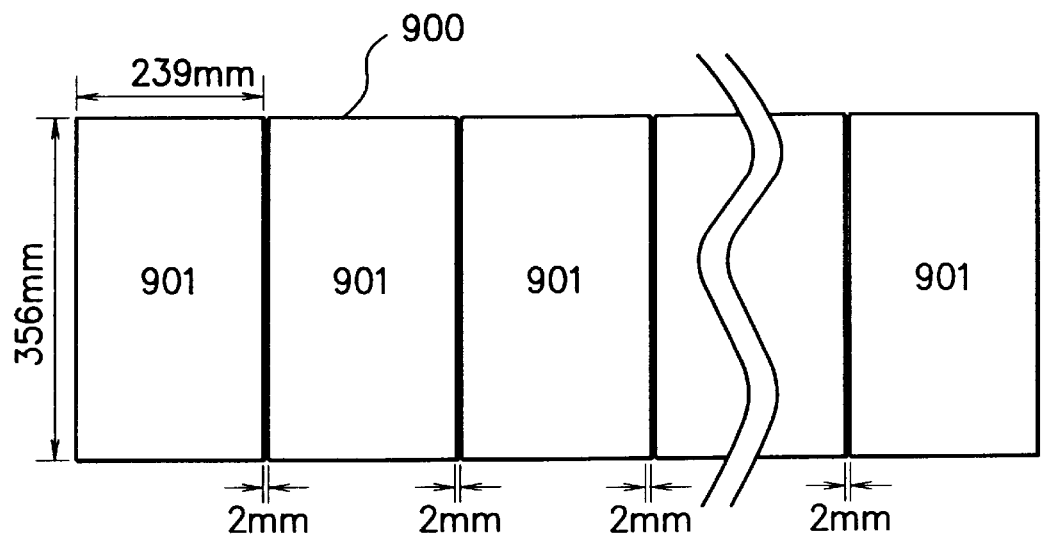
FIG. 9 is a schematic view illustrating an example of a solar cell string in the present invention.

A photovoltaic element string having such configuration as shown in FIG. 9 was prepared using some of the photovoltaic elements obtained above as will be described below. In FIG. 9, reference numeral 900 indicates the entirety of a photovoltaic element string, and reference numeral 201 is a photovoltaic element.

Ten photovoltaic elements obtained in the preparation of step were spaced at an equal interval on a jig while with their back faces downward so that the clearance between each adjacent photovoltaic elements was 2 mm (that is, the ratio of B/A=0.017). And for each adjacent photovoltaic element of these photovoltaic elements, the positive terminal member of one photovoltaic element was electrically connected to the negative terminal member of the other photovoltaic element by soldering. The 10 photovoltaic elements were electrically connected in series as described above. Thus, a photovoltaic element string 900 was obtained.

Three photovoltaic element strings were prepared using the photovoltaic elements obtained in the step of the preparation of photovoltaic element.

Preparation of Solar Cell Module

Using one of the three photovoltaic element strings obtained above, a solar cell module having such a configuration as shown in FIG. 1(*b*) was prepared in the following manner.

(1). Provision of lamination materials;

As the transparent film 123 (the surface protective film), there was provided a 50 μm thick non-oriented ETFE (ethylene-tetrafluoroethylene copolymer) film having a surface subjected to a corona-discharging treatment which is in contacted with the filler resin thereunder (hereinafter referred to as ETFE film 123).

As the transparent resin 122 (the surface side filler resin), there was provided a 460 μm thick EVA (ethylene-vinyl acetate copolymer) sheet composed of a resin composition comprising 100 parts by weight of EVA (vinyl acetate content: 33 wt. %, trademark name: MELTFLOWRATE), 1.5 parts by weight of 2,5-dimethyl-2,5 bis(t-butylperoxy) hexane as a crosslinking agent, 0.3 part by weight of 2-hydroxy-4-n-octohexybenzophenone as an UV absorber, 0.2 part by weight of tris (monophenyl)phosphate as an antioxidant, and 0.1 part by weight of (2,2,6,6-tetramethyl-4-benzyl)sebacate as a photo stabilizer. This EVA sheet will be hereinafter referred to as EVA sheet 122.

As the inorganic fibrous material 127, there was provided a nonwoven glass fiber member containing an acrylic binder in a weight amount of 40 g/cm² (hereinafter referred to as nonwoven glass fiber member 127).

As the back side filler resin 124, there were provided two 225 μm thick EVA sheets. Each of these EVA sheets will be hereinafter referred to as EVA sheet 124.

As the insulating film 125, there was provided a 100 μm thick PET (polyethylene terephthalate) film (hereinafter referred to as PET film 125).

As the reinforcing member 126, there was provided a 0.4 mm thick galvanized steel plate whose opposite faces are coated with polyester.

(2). Preparation of solar cell module:

Using the foregoing photovoltaic element string 900 [this photovoltaic element string will be hereinafter referred to as photovoltaic element string 121 (see, FIG. 1(*b*))] and the lamination materials provided in the above (1), a solar cell module having such a configuration as shown in FIG. 1(*b*) was prepared in accordance with the vacuum lamination method in the following manner.

On the mounting plate made of aluminum steel, the reinforcing member 126, the EVA sheet 124, the PET film 125, and the EVA sheet 124 were stacked in this order. Then, the photovoltaic element string 121 was stacked on the EVA sheet 124 so that its light receiving face was downward, followed by stacking the nonwoven glass fiber member 127, the EVA sheet 122, and the ETFE film 123 in this order. By this, a stacked body on the mounting plate of the laminator was formed.

Then, a release sheet comprising a PFA film (having a thickness of 0.2 mm) having a good releasing property was stacked on the surface of the stacked body. And a silicone rubber sheet (having a thickness of 2 mm) was superposed over the stacked body to seal the stacked body between the mounting plate and the silicone rubber sheet (the resultant obtained herein will be hereinafter referred to as air bag system).Thereafter, the inside of the air bag system containing the stacked body therein was evacuated to a vacuum of 2.1 Torr for 30 minutes by a vacuum pump. While continuing the evacuation of the air, the air bag system was introduced into the oven at a temperature of 160° C., where the stacked body in the air bag system was subjected to thermocompression bonding treatment for 50 minutes. After this, the air bag system was taken out from the oven, and still under reduced pressure, the stacked body in the air bag system was cooled. Thereafter, the stacked body was taken out from the vacuum laminater. Thus, a solar cell module was obtained having a 10 photovoltaic element string sealed therein.

Thus,using the foregoing three photovoltaic element strings, three solar cell modules were prepared.

EXAMPLE 2

The procedures of Example 1 were repeated, except that in the step of the preparation of the photovoltaic element string, the clearance between each adjacent photovoltaic element was made to be 5 mm (that is, the ratio of B/A= 0.042).

EXAMPLE 3

The procedures of Example 1 were repeated, except that in the step of the preparation of the photovoltaic element string, the clearance between each adjacent photovoltaic elements was made to be 0.5 mm (that is, the ratio of B/A=0.004).

COMPARATIVE EXAMPLE 1

The procedures of Example 1 were repeated, except that in the step of the preparation of the photovoltaic element string, the clearance between each adjacent photovoltaic element was made to be 0.3 mm (that is, the ratio of B/A=0.002).

COMPARATIVE EXAMPLE 2

The procedures of Example 1 were repeated, except that in the step of the preparation of the photovoltaic element string, the clearance between each adjacent photovoltaic element was made to be 6 mm (that is, the ratio of B/A= 0.051).

COMPARATIVE EXAMPLE 3

The procedures of comparative Example 1 were repeated, except that the thickness of the EVA sheet used as the transparent resin 122 (the surface side filler resin) was 920 $\mu$m.

EVALUATION

For the solar cell modules obtained in the above examples 1 to 3 and those obtained in the above comparative examples 1 to 3, an evaluation was conducted as will be described.
1. Evaluation of External Appearance of the Back Face of Photovoltaic Element This evaluation was conducted in the following manner.

For the solar cell module, the surface side covering material and the photovoltaic element string are torn off. And for one of the photovoltaic elements constituting the photovoltaic element string, examination is conducted with respect to air bubble(s) present at the back face thereof. The result is shown in Table 1 on the basis of the following criteria.

◯: a case wherein the number of air bubble(s) is less than 10, and when one or more air bubbles are present, the diameter of the maximum air bubble is smaller than 1 mm, and X: a case wherein one or more air bubbles having a diameter of larger than 1 mm are present, or 10 or more air bubbles having a diameter of 1 mm or less are present.
2. Temperature-Humidity Cycle Test In this test, the solar cell module was subjected ten times to exposing to a cycle comprising: (1) exposing an atmosphere at 85° C. and 85% RH for 20 hours, (ii) resting for an hour, (iii) exposing to an atmosphere at −40 for an hour and (iv) resting for an hour.

The solar cell module thus endured was evaluated as will be described below.

(1). For the solar cell module, the photovoltaic elements of the photovoltaic are examined with respect to an external appearance of their back face. The result is shown in Table 1 on the basis of the following criteria.

◯: a case wherein the external appearance of the back face is satisfactory, and

X: a case wherein the back side resin is peeled from one or more of the photovoltaic elements and the peeled portion is protruded.

(2). For the solar cell module, the photovoltaic elements of the photovoltaic are examined with respect to their inter element portion. The examined result is shown in Table 1 on the basis of the following criteria.

◯: a case wherein the inter element portion is satisfactory in terms of the external appearance and is free of air bubbles, and X: a case wherein one or more air bubbles or/and lamination defect(s) are present in the inter element portion.
3. High Temperature-High Humidity Endurance Test In this test, the solar cell module was exposed to an atmosphere at 85° C. and 85% RH for 1000 hours.

The solar cell module was then evaluated as will be described below.

(1). For the solar cell module, the photovoltaic elements of the photovoltaic are examined with respect to external appearance of their back face. The result is shown in Table 1 on the basis of the following criteria.

◯: a case wherein the external appearance of the back face is satisfactory, and

X: a case wherein the back side resin is peeled from one or more of the photovoltaic elements and the peeled portion is protruded.

(2). For the solar cell module, the photovoltaic elements of the photovoltaic are examined with respect to their inter element portion. The result is shown in Table 1 on the basis of the following criteria.

◯: a case wherein the inter element portion is satisfactory in terms of the external appearance and is free of air bubbles, and X: a case wherein one or more air bubbles or/and lamination defect(s) are present in the inter element portion.

4. Evaluation of the Step Between Adjacent Photovoltaic Element and the Thickness of the Resin Covering the Serialized Portion In this evaluation, for the solar cell module, a cross section of portions were connected in series was obtained. And the cross section was examined, the maximum step between adjacent photovoltaic elements was measured, and the minimum thickness of the resin covering the.

The measured results are shown in Table 1.

5. UV test

In this test, the solar cell module was subjected to an alternate repetition 228 times of a cycle of exposing it to irradiation of light having a wavelength of 300 to 400 nm at 100 mW/cm$^2$ and at 70° C. as the temperature of a black panel and 70% RH as the environmental humidity, for 5 hours and a cycle of exposing to a dark atmosphere at 30° C. and 96% RH 28° C. for as the temperature of a test panel to cause dew condensation on the surface of the solar cell module for 6 hours 288 times.

For the solar cell module thus exposed, a part of the serialized portions is cut to obtain a specimen. The specimen was. The examined result is shown in Table 1 on the basis of the following criteria.

⊚: a case wherein the exterior appearance sufficient,

◯: a case wherein several glass fibers of the nonwoven glass fiber member are observed but they are not problematic in practice, and X: a case wherein one or more bunches of glass fibers from the nonwoven glass fiber member have risen to the surface and one or more airgaps are present in the transparent resin.

6. Heat Resistance Test

In this test, without considering an increase in the open circuit voltage and the fill factor due to the heat annealing effect on the solar cell module, in order to evaluate the heat resistance of the lamination materials used on the light receiving face side, they were laminated on a slide glass having a thickness of 0.5 mm. And for a laminate formed on the slide glass, its initial transmittance of light having a wavelength of 400 nm was measured. Then, the slide glass having the laminate thereon was exposed to an atmosphere at 120° C. for 1000 hours. After this, its transmittance for light having a wavelength of 400 nm was measured. And a rate of change between the initial transmittance and the transmittance upon exposure was obtained. The result is shown in Table 1.

7. Evaluation of Lamination Defect(s) in Inter Element Portion

In this evaluation an examination was optically conducted to determine whether or not lamination defect(s) (comprising white stripe(s) in a wave-like form) is present in the inter element portion of adjacent photovoltaic elements.

Incidentally, such lamination defect will occur when a solar cell module formed as a result of the vacuum lamination treatment is taken out from the jig or a solar cell module is transported, one or more portions of the solar cell module which are corresponding to one or more of the clearances between adjacent photovoltaic elements in the solar cell module are curved whereby the glass fiber member in the surface side covering material is fractured or peeling between the glass fiber member and the transparent resin in the surface side covering material to case air gap(s), resulting in white stripe(s) in one or more inter element portions.

The result is shown in Table 1 on the basis of the following criteria.

◯: a case wherein no lamination defect is observed and the inter element portions is satisfactory in terms of the exterior appearance, and X: a case wherein apparent lamination defect(s) is observed in one or more inter element portions.

DISCUSSION OF THE RESULTS IN THE ABOVE EVALUATIONS

With Respect to the Above Evaluation Times 1 and 2

In examples 1 to 3, because the deaeration and degassing of the back face side of photovoltaic element string could be sufficiently conducted, no air bubbles leading to a fatal defect were formed. Also, there was no peeling between the back side filler resin and the photovoltaic elements of the photovoltaic element string.

On the other hand, in comparative example 1, the clearance between adjacent photovoltaic elements was excessively small. Hence, the deaeration and degassing of the back face side of the photovoltaic element string could not be sufficiently conducted, and as a result, air bubbles remained in the back face side of the photovoltaic element string. Because of this, in the temperature-humidity cycle test, these air bubbles expanded to cause peeling between the back side filler resin and the photovoltaic elements of the photovoltaic element string.

With Respect to the Above Evaluation Items 3 and 7

In comparative example 2, when the solar cell module formed as a result of the vacuum lamination treatment taken out from the jig or when the solar cell module was transported, the glass fiber member in the surface side covering material was fractured or peeling occurred between the glass fiber member and the transparent resin in the surface side covering material to cause air gap(s), where lamination defect(s) comprising white stripe(s) occurred. In the evaluation item 3 (the high temperature-high humidity endurance test), moisture accumulated in the air gap(s), whereby adhesion of the transparent resin decreased to facilitate the peeling between the glass fiber member and the transparent resin.

In examples 1 to 3, neither of the portions of the solar cell module which are corresponding to the clearances between adjacent photovoltaic elements curved nor fractured, and because of this, no lamination defects (white stripe) occurred in any of the inter element portions. And even after the high temperature-high humidity test, the solar cell module was free of peeling.

With Respect to the Above Evaluation Item 5

The thickness of the connection material (comprising the insulating tape, the positive terminal member and the insulating adhesive) in each of the examples 1 to 3 and the comparative examples 1 to 3 was 455 μm. In each of the examples 1 and 3 and the comparative example 2, the maximum step between adjacent photovoltaic elements was found to be less than 455 μm. In any of these solar cell modules, the minimum thickness of the transparent resin (EVA) on the serialized portion was greater than 200 μm (see, Table 1), and because of this, a good result was obtained in the UV test. In example 2, the maximum thickness of the transparent resin (EVA) was less than 200 μm, and several glass fibers were observed. But this was found to be to an extent which is not problematic in practice.

On the other hand, in comparative example 1, the clearances between adjacent photovoltaic elements were excessively small, and because of this, for each adjacent photovoltaic elements, one photovoltaic element got on the other photovoltaic element. The maximum thickness of the transparent resin (EVA) on the portion connected in series was only 90 m (see, Table 1). And after the UV test, the rise of the glass fiber to the surface was observed. In this solar cell module, when the practical use thereof is considered, dew condensation occurred due to wetting or cooling to corrode the serialized portions, resulting in deterioration in the characteristics of the solar cell module.

In comparative example 3, the clearance of each adjacent photovoltaic elements was the same as that in the comparative example 1, but because the thickness of the EVA sheet used as the transparent resin 122 was greater than that in the comparative example 1, the minimum thickness of the transparent resin on the portion connected in series as large as 620 $\mu$m. Thus, a good result was obtained in the UV test.

With Respect to the Foregoing Evaluation Item 6

In comparative example 3, although the thickness of the EVA sheet used as the transparent resin 122 was increased in order to improve the surface side protective ability, the scratch resistance could be more improved in comparison with that in comparative example 1. But, in the heat resistance test, a substantial yellowing in the surface side covering material was observed. Because of this, the photoelectric conversion efficiency of the solar cell module in the comparative example 3 is markedly decreased in that the quantity of incident light impinged to reach the photovoltaic element string is decreased.

SUMMARY OF THE RESULTS OBTAINED IN THE EVALUATION OF THE ABOVE EVALUATION ITEMS 1 TO 3 AND 7

Figure 11:
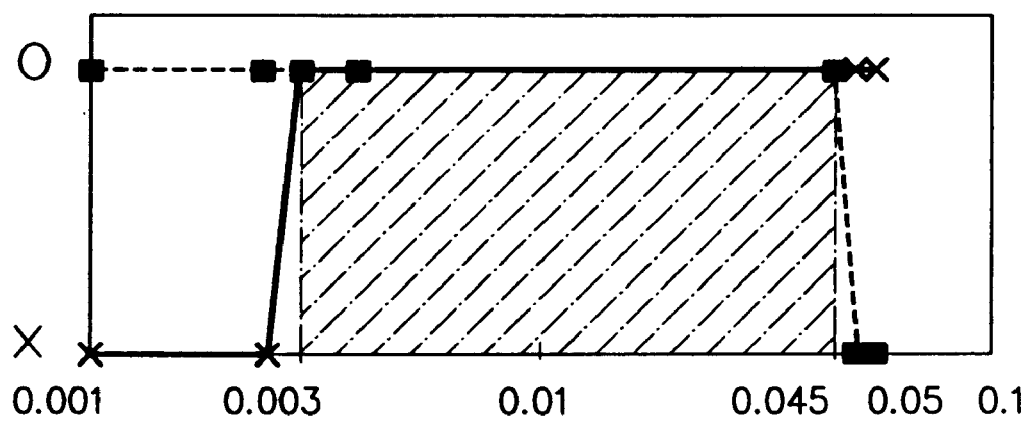
FIG. 11 is a graph showing evaluated results of solar cell modules in relation to area ratios B/A in said solar cell modules in examples and comparative examples which will be later described.

The interrelations of the above described results obtained in the evaluation of the above items 1 and 3, and 7 to the area ratio of B/A are collectively and graphically shown in FIG. 11.

In FIG. 11, the evaluated results with respect to the back face of the photovoltaic element are collectively shown by a solid line based on the following norm 1, and the evaluated results with respect to the inter element portion are collectively shown by a broken line based on the following norm 2.

Norm 1

○: the exterior appearance of the back face of is sufficient,

X: residual air bubble(s) or land peeling of the laminated material due to insufficiency in the deaeration or degassing are observed in the back face side of the photovoltaic element.

Norm 2

○: the exterior appearance of the inter element portion is satisfactory,

X: lamination defect(s) (white stripe(s)) residual air bubble(s), or peeling of the laminated material are observed in the inter element portion.

On the basis of the results shown in FIG. 11, it is understood that for a solar cell module produced by vacuum-laminating a photovoltaic element comprising a plurality of photovoltaic elements electrically connected with each other, by making the area ratio of B/A with respect to the photovoltaic elements in an range of 0.003 to 0.045, the solar cell module becomes highly reliable.

As apparent from the above description, according to the present invention, upon the vacuum lamination in order to produce a solar cell module, deaeration and degassing can be sufficiently accomplished. This situation enables to efficiently produce a solar cell module having sufficient rigidity and excellent reliability.

TABLE 1

| | external appearance of the back face of photovoltaic element | temperature-humidity cycle test element's back face | temperature-humidity cycle test inter elements portion | high temperature-high humidity endurance test element's back face | high temperature-high humidity endurance test inter element portion | step between adjacent photovoltaic portion ($\mu$m) | resin thickness on serialized portion ($\mu$m) | UV test | heat resistance test (%) | lamination defet(s) of inter element portion |
|---|---|---|---|---|---|---|---|---|---|---|
| Example 1 | ○ | ○ | ○ | ○ | ○ | 325 | 235 | ○ | −3 | ○ |
| Example 2 | ○ | ○ | ○ | ○ | ○ | 415 | 125 | ○ | −3 | ○ |
| Example 3 | ○ | ○ | ○ | ○ | ○ | 296 | 265 | ○ | −3 | ○ |
| Comparative Example 1 | X | X | ○ | X | ○ | 633 | 90 | X | −3 | ○ |
| Comparative Example 2 | ○ | ○ | X | ○ | X | 330 | 245 | ○ | −3 | X |
| Comparative Example 3 | ○ | ○ | ○ | ○ | ○ | 320 | 620 | ⊙ | −7 | ○ |

What is claimed is:

1. A solar cell module which comprises a photovoltaic element string comprising a plurality of photovoltaic elements each formed on an independent substrate, said plurality of photovoltaic elements being electrically connected with each other by means of an electric connection material, said photovoltaic element string being sealed by a sealing material disposed so as to cover said photovoltaic element string and said electric connection material, wherein when an area of one (a) of said plurality of photovoltaic elements is represented by A and a sum of clearance areas between said photovoltaic element (a) and adjacent photovoltaic elements (b) situated next to said photovoltaic element (a) is represented by B, the area ratio of B/A is in a range of 0.003 to 0.045.

2. The solar cell module according to claim 1, wherein the number of the adjacent photovoltaic elements (b) situated next to the photovoltaic element (a) is two or more.

3. The solar cell module according to claim 1, wherein the plurality of photovoltaic elements are electrically connected with each other in series connection or in parallel connection.

4. The solar cell module according to claim 1, wherein each of the plurality of photovoltaic elements is shaped in a square form or a rectangular form.

5. The solar cell module according to claim 1, wherein a surface level difference exists between each pair of adjacent photovoltaic elements, said surface level difference being smaller than the thickness of said electric connection material.

6. The solar cell module according to claim 1, wherein a portion of the sealing material situated on the electric connection material of connecting each adjacent photovoltaic elements of the plurality of photovoltaic elements has a thickness of 200 μm or more.

7. The solar cell module according to claim 1, wherein the electric connection material which connects each pair of adjacent photovoltaic elements is arranged on the light receiving face side of the photovoltaic element string.

8. The solar cell module according to claim 1, wherein the electric connection material which connects each pair of adjacent photovoltaic elements comprises a metal foil member whose surface is covered by an electrically insulating material.

9. The solar cell module according to claim 7, wherein an electrode having a polarity which is different from that of the electric connection material is provided at the back face of each photovoltaic element.

10. The solar cell module according to claim 1, wherein a transparent resin and a transparent film are sequentially arranged at least on the light receiving face side of the photovoltaic element string and a reinforcing member is provided at the back face side of the photovoltaic element string.

* * * * *

UNITED STATES PATENT AND TRADEMARK OFFICE
CERTIFICATE OF CORRECTION

PATENT NO. : 6,175,075 B1
DATED : January 16, 2001
INVENTOR(S) : Hidenori Shiotsuka et al.

It is certified that error appears in the above-identified patent and that said Letters Patent is hereby corrected as shown below:

Title page,
Item [56], U.S PATENT DOCUMENTS "5/1960 Dickson" should read -- 7/1956 Dickson --; and
Line 12, "5,542,989" should read -- 5,524,989 --.

Item [57], ABSTRACT,
Line 7, "clearances" should read -- clearance. --; and
Line 12, "by" should read -- comprises --.

Column 3,
Line 6, "a" should be deleted;
Line 39, "ine" should read -- in --;
Line 48, "difficult" should read -- difficult to --; and
Line 54, "element," should read -- element --.

Column 5,
Line 49, "is remains" should read -- remains --.

Column 6,
Line 10, "suffer" should read -- suffers --;
Line 55, "is" should be deleted; and
Line 62, "considered ." should read -- considered. --

Column 8,
Line 59, "above" should read -- above- --.

Column 9,
Line 19, "8(c)" should read -- 8(c). --.

Column 11,
Line 43, "bubble" should read -- bubbles --.

Column 12,
Line 57, "an" should read -- to an --.

Column 15,
Line 36, "member" should read -- member. --; and
Line 47, "imideamide" should read -- imideamide. --.

UNITED STATES PATENT AND TRADEMARK OFFICE
CERTIFICATE OF CORRECTION

PATENT NO. : 6,175,075 B1
DATED : January 16, 2001
INVENTOR(S) : Hidenori Shiotsuka et al.

It is certified that error appears in the above-identified patent and that said Letters Patent is hereby corrected as shown below:

Column 16,
Line 8, "and" should read -- butyral resins, urethane resins, and --;
Line 30, "termocompression" should read -- thermocompression --;
Line 50, "portion" (second occurrence) should be deleted;
Line 54, "a" should read -- an --;
Line 64, "an" should read -- a --; and
Line 67, "an" should read -- a --.

Column 18,
Line 10, "to" should be deleted.
Line 29, "is" should be deleted;
Line 42, "crack." should read -- cracks. --; and
Line 54, "an" should read -- a --.

Column 21,
Line 24, "an" should read -- a --; and
Line 25, "0.045" should read -- 0.045. --.

Column 24,
Line 50, "an" should read -- a --.

Column 25,
Line 38, "Thus,using" should read -- Thus, using --;
Line 45, "made to be" should be deleted;
Line 52, "made to be" should be deleted;
Line 59, "made to be" should be deleted; and
Line 66, "made to be" should be deleted.

Column 26,
Line 30, "exposing to" should be deleted, and "an" should read -- to an --; and
Line 32, "—40" should read -- 40 --.

Column 27,
Line 17, "the." should read -- the portion connected in series was measured. --;
Line 22, "irradiation of light having" should read -- light irradiation at --;
Line 25, "96%" should read -- 96% with -- and "for" should be deleted; and
Line 31, "was." should read -- was examined. -- and "examined" should be deleted.

UNITED STATES PATENT AND TRADEMARK OFFICE
CERTIFICATE OF CORRECTION

PATENT NO. : 6,175,075 B1
DATED : January 16, 2001
INVENTOR(S) : Hidenori Shiotsuka et al.

It is certified that error appears in the above-identified patent and that said Letters Patent is hereby corrected as shown below:

Column 29,
Line 17, "as" should read -- could be as --; and
Line 66, "of" (second occurrence) should be deleted.

Column 29-30
Table 1, "portion" should read -- elements --; and "defet(s)" should read -- defects(s) --.

Column 30,
Line 16, "an" should be deleted.

Signed and Sealed this

Fifth Day of March, 2002

JAMES E. ROGAN
*Director of the United States Patent and Trademark Office*

*Attest:*

*Attesting Officer*